US012795975B2

(12) United States Patent
Zhou et al.

(10) Patent No.: US 12,795,975 B2
(45) Date of Patent: Nov. 10, 2026

(54) HIGH-ELECTRON-MOBILITY TRANSISTOR STRUCTURE AS WELL AS FABRICATING METHOD AND USE THEREOF

(71) Applicant: SUZHOU INSTITUTE OF NANO-TECH AND NANO-BIONICS (SINANO) , CHINESE ACADEMY OF SCIENCES, Suzhou (CN)

(72) Inventors: Yu Zhou, Suzhou (CN); Qian Sun, Suzhou (CN); Qian Li, Suzhou (CN); Xinkun Zhang, Suzhou (CN); Jianxun Liu, Suzhou (CN); Xiaoning Zhan, Suzhou (CN); Yaozong Zhong, Suzhou (CN); Hui Yang, Suzhou (CN)

(73) Assignee: SUZHOU INSTITUTE OF NANO-TECH AND NANO-BIONICS (SINANO) CHINESE ACADEMY OF SCIENCES, Suzhou (CN)

( * ) Notice: Subject to any disclaimer, the term of this patent is extended or adjusted under 35 U.S.C. 154(b) by 419 days.

(21) Appl. No.: 18/284,891

(22) PCT Filed: Oct. 11, 2022

(86) PCT No.: PCT/CN2022/124581
§ 371 (c)(1),
(2) Date: Sep. 29, 2023

(87) PCT Pub. No.: WO2023/109277
PCT Pub. Date: Jun. 22, 2023

(65) Prior Publication Data

US 2024/0186405 A1 Jun. 6, 2024

(30) Foreign Application Priority Data

Dec. 13, 2021 (CN) ......................... 202111528051.8
May 10, 2022 (CN) ......................... 202210490618.5

(51) Int. Cl.
*H10D 30/47* (2025.01)
*H10D 30/01* (2025.01)
(Continued)

(52) U.S. Cl.
CPC ......... *H10D 30/475* (2025.01); *H10D 30/015* (2025.01); *H10D 62/151* (2025.01); *H10D 62/8503* (2025.01); *H10D 64/513* (2025.01)

(58) Field of Classification Search
CPC .. H10D 30/475; H10D 30/015; H10D 62/151; H10D 62/8503; H10D 64/513;
(Continued)

(56) References Cited

U.S. PATENT DOCUMENTS

2014/0091309 A1 4/2014 Hallin et al.
2020/0388701 A1 * 12/2020 Hickman ............. H10D 64/411
(Continued)

FOREIGN PATENT DOCUMENTS

CN 102629624 A 8/2012
CN 102637726 A 8/2012
(Continued)

OTHER PUBLICATIONS

Tongde Huang, et al., DC and RF Performance of Gate-Last AlN/GaN MOSHEMTs on Si With Regrown Source/Drain, IEEE Transactions on Electron Devices, 2013, pp. 3019-3024, vol. 60 No. 10.

(Continued)

*Primary Examiner* — Christine S. Kim
*Assistant Examiner* — Nathalie R Fayette
(74) *Attorney, Agent, or Firm* — Bayramoglu Law Offices LLC

(57) ABSTRACT

A high-electron-mobility transistor structure as well as a fabricating method and use thereof are provided. The high-electron-mobility transistor structure includes an epitaxial structure as well as a source electrode, a drain electrode and a gate electrode, where the epitaxial structure includes a first semiconductor layer and a second semiconductor layer, a carrier channel is formed between the first semiconductor layer and the second semiconductor layer, and the source electrode is electrically connected with the drain electrode through the carrier channel; a coincidence rate between the orthographic projection of the gate foot of the gate electrode on the first semiconductor layer and the orthographic projection of the second semiconductor layer on the first semiconductor layer is more than 80%.

13 Claims, 13 Drawing Sheets

(51) Int. Cl.
*H10D 62/13* (2025.01)
*H10D 62/85* (2025.01)
*H10D 64/27* (2025.01)

(58) Field of Classification Search
CPC ... H10D 64/679; H10D 64/256; H10D 64/518
See application file for complete search history.

(56) References Cited

U.S. PATENT DOCUMENTS

| | | | | |
|---|---|---|---|---|
| 2021/0013307 | A1* | 1/2021 | Moon | H10D 62/824 |
| 2021/0098285 | A1 | 4/2021 | LaRoche et al. | |
| 2022/0376060 | A1* | 11/2022 | Grote | H10D 30/475 |

FOREIGN PATENT DOCUMENTS

| | | | |
|---|---|---|---|
| CN | 103887335 | A | 6/2014 |
| CN | 105470294 | A | 4/2016 |
| JP | 2000208754 | A | 7/2000 |
| JP | 2003142501 | A | 5/2003 |
| JP | 2013500606 | A | 1/2013 |
| JP | 2017163082 | A | 9/2017 |
| JP | 2018206994 | A | 12/2018 |

OTHER PUBLICATIONS

Tongde Huang, et al., Enhancement-Mode AlN/GaN MOSHFETs on Si Substrate With Regrown Source/Drain by MOCVD, IEEE Transactions on Electron Device Letters, 2012, pp. 1123-1125, vol. 33 No.8.

Fu Chen, et al., High-resistivity unintentionally carbon-doped GaN layers with nitrogen as nucleation layer carrier gas grown by metal-organic chemical vapor deposition, AIP Advances, 2017, pp. 1-7, vol. 7, 125018.

* cited by examiner

HIGH-ELECTRON-MOBILITY TRANSISTOR STRUCTURE AS WELL AS FABRICATING METHOD AND USE THEREOF

CROSS REFERENCE TO THE RELATED APPLICATIONS

This application is the national phase entry of International Application No. PCT/CN2022/124581, filed on Oct. 11, 2022, which is based upon and claims priority to Chinese Patent Application No. 202111528051.8, filed on Dec. 13, 2021; and Chinese Patent Application No. 202210490618.5, filed on May 10, 2022, the entire contents of which are incorporated herein by reference.

TECHNICAL FIELD

The present application relates to a high-electron-mobility transistor structure as well as a fabricating method and use thereof, belonging to the technical field of semiconductor devices.

BACKGROUND

New-generation wide bandgap semiconductor material gallium nitride (GaN) simultaneously has the advantages of high breakdown voltage (3.1 MV/cm), high-electron-mobility (about 1500 $cm^2/V·s$) and the like. A GaN-based heterostructure (such as AlGaN/GaN, AlInGaN/GaN and AlN/GaN) can form high-density two-dimensional electron gas (2DEG) without deliberate doping due to the presence of polarization effect, and therefore it becomes an ideal selection of a new-generation electronic device, namely transverse high-electron-mobility transistor (HEMT). GaN HEMT has the significant advantages of high current density, high voltage tolerance, high frequency and the like, and therefore as a radiofrequency power amplifier (PA), it has been successfully applied to 5G core infrastructures such as a base station, and is gradually replacing the traditional silicon-based lateral double-diffused metal-oxide-semiconductor (LDMOS) device and continuously plays an important role in the whole 5G communication technology.

In the field of consumer electronics having a wider market prospect, the silicon-based GaN HEMT has attractions in the application of low-cost radio frequency (RF)/millimeter wave (MM Wave) as well. Compared with the traditional gallium arsenide (GaAs) heterojunction bipolar transistor (HBT), GaN HEMT exhibits stronger power output ability and more excellent heat dissipation performance, so it can stand out its inherent advantages in 5G communication services with higher power requirements, and is expected to be applied to transmitting terminal PA in RF front-end modules of mobile phones. However, currently, there is no GaN RFHEMT that is really applied to mobile terminals for the reasons that the conventional GaN HEMT has inherent defects in the aspect of device structures: along a channel direction, there are gate-source access regions and gate-drain access regions of the device, thus introducing a large proportion of series resistance $R_{ac}$ so that voltages effectively applied to both sides of the channel are greatly reduced, the saturation behavior of the output current of the device is physically fundamentally restricted, thereby resulting in the occurrence of pinch saturation ahead of speed saturation so as not to reduce the $V_{knee}$ (Knee Voltage), as shown in FIG. 1. Due to relatively low work voltage (generally 3-5 V) of a mobile intelligent terminal, the large $V_{knee}$ (generally 2-3V) of GaN HEMT seriously restricts its low-voltage application, and cannot play its advantage of high output power density. In another aspect, the conventional GaN HEMT structure inevitably has gate-source channel resistance $R_{GS}$ which can generate a non-linear effect closely associated with electron mobility degeneration, deteriorates output current and linearity, and seriously restricts the PA application of devices in mobile intelligent terminals. In addition, the current device structure and process technology are extremely difficultly used for fabricating GaN HEMT applied to radio frequency.

In order to solve the above problems, it is a feasible solution to shorten a source-drain spacing as far as possible under the condition of allowing a semiconductor process technology. By using the solution, a source-drain high electric field can be built in a case of small source-drain voltage, so that speed saturation occurs ahead of pinch saturation, thereby effectively reducing the knee voltage. At present, researchers adopt a side wall technology to fabricate GaN HEMT having a source-drain spacing of 130 nm; also, researchers adopt the conventional photolithographic process and electron beam exposure technology to fabricate short channel GaN HEMT (<500 nm). However, neither of the devices fabricated by using the above solution avoids gate-source access regions and gate-drain access regions, so the linearity degradation of the device when outputting high current is relatively serious.

In another aspect, it is extremely difficult to fabricate enhanced GaN HEMT applied to RF (and millimeter wave) by using the conventional solution, and therefore the enhanced working mode of PA is necessary for the RF frontend of the mobile intelligent terminal in order to simplify the system and reduce the area of the chip. At present, for only Intel in the world, a barrier layer slow etching technology is utilized to fabricate enhanced GaN RFHEMT. However, this technology puts forward extremely high requirements on etching accuracy and controllability, which is difficult to achieve. Besides, researchers propose a p-NiO gate electrode technology to develop enhanced GaN RFHEMT, however, p-NiO difficultly grows to a certain extent, and has poor thermal stability.

SUMMARY

The main objective of the present application is to provide a near full-gate controlled high-electron-mobility transistor structure of T-type gate, which uses a composite layer composed of a heavily doped ohmic contact layer and a high resistance layer as a support layer and realizes spatial isolation from the heavily doped ohmic contact layer by utilizing air, as well as a fabricating method and use thereof, in order to overcome the defects in the prior art.

To achieve the above-mentioned objective of the present application, the present application adopts the following technical solution:

One aspect of the present application provides a high-electron-mobility transistor structure, comprising:

- an epitaxial structure, comprising a heterojunction consisting of a first semiconductor layer and a second semiconductor layer, a carrier channel being formed between the first semiconductor layer and the second semiconductor layer; and
- a source electrode, a drain electrode and a gate electrode, the source electrode being electrically connected with the drain electrode through the carrier channel;
- wherein, a coincidence rate between the orthographic projection of the gate foot of the gate electrode on the first semiconductor layer and the orthographic projectiontion of the second semiconductor layer on the first semiconductor layer is more than 80%.

One aspect of the present application provides another high-electron-mobility transistor structure, comprising an epitaxial structure as well as a source electrode, a drain electrode and a gate electrode which are matched with the epitaxial structure, wherein the epitaxial structure comprises a heterojunction in which a carrier channel is formed, the carrier channel is distributed in a region covered by the orthographic projection of the gate electrode on the epitaxial structure; wherein, the epitaxial structure further comprises a heavily doped region and a high resistance region, the heavily doped region is arranged on the heterojunction and forms ohmic contact with the carrier channel, the source electrode, the drain electrode and the heavily doped region form ohmic contact, the high resistance region is arranged on the heavily doped region, and the source electrode is isolated from the gate electrode by the high resistance region and the drain electrode is isolated from the gate electrode by the high resistance region.

Another aspect of the present application provides a fabricating method of a high-electron-mobility transistor structure, comprising:

a step of fabricating an epitaxial structure, the epitaxial structure comprising a heterojunction comprising a first semiconductor layer and a second semiconductor layer, and a carrier channel being formed between the first semiconductor layer and the second semiconductor layer, and a step of fabricating a source electrode, a drain electrode and a gate electrode which are matched with the epitaxial structure, the source electrode being electrically connected with the drain electrode through the carrier channel;

wherein, the step of fabricating the gate electrode comprises: the size of the gate foot of the gate electrode is set to meet the following conditions: a coincidence rate between the orthographic projection of the gate foot of the gate electrode on the first semiconductor layer and the orthographic projection of the second semiconductor layer on the first semiconductor layer is more than 80%. That is, the orthographic projection of the gate foot on the first semiconductor layer almost covers the orthographic projection of the second semiconductor layer on the first semiconductor layer.

Another aspect of the present application further provides a fabricating method of a high-electron-mobility transistor structure, comprising:

successively growing a first semiconductor layer and a second semiconductor layer to form a heterojunction, and allowing the carrier channel in the heterojunction to be distributed on a region covered by the orthographic projection of the gate electrode on the epitaxial structure;

fabricating a heavily doped region and a high resistance region on the heterojunction, and arranging the high resistance region on the heavily doped region and allowing the heavily doped region and the carrier channel to form ohmic contact so as to form the epitaxial structure; and fabricating a source electrode, a drain electrode and a gate electrode which are matched with the epitaxial structure and allowing the source electrode, the drain electrode and the gate electrode to form ohmic contact with the heavily doped region, and isolating the source electrode from the gate electrode by the high resistance region and isolating the drain electrode and the gate electrode both by the high resistance region.

Another aspect of the present application further provides use of the high-electron-mobility transistor structure in fabricating power amplifiers, radio frequency devices, communication devices or electronic devices.

Another aspect of the present application further provides a power amplifier, comprising the high-electron-mobility transistor structure.

Compared with the prior art, the present application has the advantages:

1) the high-electron-mobility transistor structure provided by the embodiments of the present application has no gate-source access regions and gate-drain access regions, and the entire two-dimensional electronic gas carrier channel is effectively regulated by the gate electrode, and the non-linear effect induced by $R_{GS}$ resistance degeneration is eliminated on the basis of achieving speed saturation and reducing the knee voltage of the device;

2) the high-electron-mobility transistor structure provided by the embodiments of the present application has high reliability, stability and transconductance, which is conducive to greatly improving the power gain of the radio frequency amplifier;

3) the fabricating method of the high-electron-mobility transistor structure provided by the embodiments of the present application adopts a self-alignment process and secondary epitaxy technology, uses the composite material of the heavily doped layer and the high resistance layer as the support layer and realizes spatial isolation from the heavily doped ohmic contact layer by utilizing air, and a T-type gate is directly built between the source electrode and the drain electrode, thereby achieving the high-electron-mobility transistor structure with a short channel, near full gate electrode control, near no access area series resistance and low parasitic effect, and improving the frequency feature, output efficiency and reliability of the device while effectively reducing the knee voltage of the device and improving the linearity of the device;

4) the high-electron-mobility transistor structure provided by the embodiments of the present application adopts a thin barrier-based heterojunction epitaxial structure, and can achieve the fabricating of the enhanced device without a groove etching technology, and the thin barrier-based material structure makes the device have large transconductance, which is conducive to improving the gain of the radio frequency power amplifier.

BRIEF DESCRIPTION OF THE DRAWINGS

To more clearly illustrating the technical solution in the embodiments of the present application or in the prior art, the accompanying drawings required to be used in the embodiments or in the prior art will be simply discussed below, obviously, the drawings in the following description are only some embodiments of the present application, and other drawings can also be obtained by persons of ordinary skill in the art without creative efforts.

DETAILED DESCRIPTION OF THE EMBODIMENTS

Figure 1:
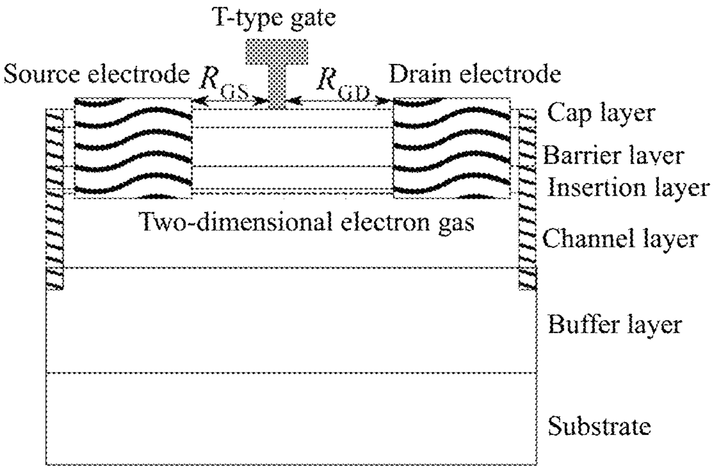
FIG. 1 (Prior Art)
FIG. 1 is a structural diagram of a high-electron-mobility transistor structure in the prior art.

In view of the defects in the prior art, the applicant of this case puts forward the technical solution of the present application through long-term researches and lots of practices. The present application provides a high-electron-mobility transistor structure. The composite layer of the heavily doped layer and the high resistance layer is grown by secondary epitaxy. On the one hand, the heavily doped region formed by the heavily doped layer can effectively reduce the source-drain ohmic contact resistance, and on the other hand, gate-source and gate-drain high resistance materials can effectively reduce the parasitic capacitance and suppress the leakage of the gate electrode, thereby ensuring the reliability of the device while improving the frequency characteristics of the device.

One aspect of the embodiments of the present application provides a high-electron-mobility transistor structure, which, for example, can be a GaN electronic device structure, comprising:

an epitaxial structure, comprising a heterojunction comprising a first semiconductor layer and a second semiconductor layer, a carrier channel being formed between the first semiconductor layer and the second semiconductor layer; and a source electrode, a drain electrode and a gate electrode which are matched with the epitaxial structure, the source electrode being electrically connected with the drain electrode through the carrier channel;

wherein, a coincidence rate between the orthographic projection of the gate foot of the gate electrode on the first semiconductor layer and the orthographic projection of the second semiconductor layer on the first semiconductor layer is more than 80%, preferably more than 90%, preferably more than 95%, preferably 99%, especially preferably 100%.

That is, the orthographic projection of the gate foot of the gate electrode on the first semiconductor layer basically coincides with the orthographic projection of the second semiconductor layer on the first semiconductor layer. Preferably, the orthographic projection of the gate foot coincides with the orthographic projection of the second semiconductor layer on the first semiconductor layer.

In some embodiments, the gate electrode comprises a first part and a second part which are successively distributed in a direction away from the second semiconductor layer, wherein the first part is the gate foot and the radial size of the first part is smaller than or equal to that of the second part. Especially, the gate electrode consists of the first part and the second part, the radial size of the first part is smaller than that of the second part. Where, the first part and the second part can be integrally formed.

In some specific embodiments, the gate electrode is a T-type gate, but is not limited thereto. For example, the gate electrode can also be a T-type gate, a trapezoid-type gate electrode, etc.

In some embodiments, the second semiconductor layer is relatively thin and the gate electrode is isolated from the second semiconductor layer by the dielectric layer, thereby forming an enhanced device. Of course, the second semiconductor layer is relatively thick and the dielectric layer cannot be arranged between the gate electrode and the second semiconductor layer, thereby forming a depletion-mode device.

In some embodiments, an insertion layer is also arranged between the first semiconductor layer and the second semiconductor layer.

In some embodiments, a cap layer is also distributed between the dielectric layer and the second semiconductor layer.

In some embodiments, the epitaxial structure also comprises an ohmic contact layer, the ohmic contact layer is in contact with the carrier channel, the source electrode and the drain electrode are both arranged on the ohmic contact layer and form ohmic contact with the ohmic contact layer.

Further, the ohmic contact layer is arranged on the first semiconductor layer and is in contact with the carrier channel.

In some embodiments, the ohmic contact layer and the carrier channel form ohmic contact.

In some embodiments, a groove is distributed between a source electrode region and a drain electrode region on the ohmic contact layer, the bottom of the at least gate foot and the second semiconductor layer are both arranged in the groove. Further, the gate foot of the gate electrode can be entirely arranged in the groove.

Further, an included angle of 60-90° is formed between the side wall of the groove and the surface of the first semiconductor layer, especially preferably an included of 90°. That is, the side wall of the groove is almost vertical to the surface of the first semiconductor layer. Further, the gate cap of the gate electrode covers the groove.

In some embodiments, the gate electrode is electrically isolated from the ohmic contact layer by the dielectric layer, the dielectric layer arranged between the gate electrode and the ohmic contact layer can be defined as a dielectric side wall; or, the gate electrode is isolated from the heavily doped ohmic contact layer by air.

More preferably, the epitaxial structure can adopt a thin barrier structure. Of course, in same cases, the epitaxial structure can also adopt a thick barrier structure.

More preferably, the radial size of the gate foot of the gate electrode can be set as 10 nm-500 nm.

In some embodiments, the epitaxial structure can further comprise a P-type layer arranged on the second semiconductor layer, etc., and the gate electrode is arranged on the P-type layer, so as to form a P-type gate enhanced device.

In some embodiments, the ohmic contact layer is also provided with a sacrificial layer, and the at least local regions of the source electrode, the drain electrode and the gate electrode are exposed out of the sacrificial layer. The material of the sacrificial layer includes but is not limited to PI glue, BCB glue (Benzo-Cyclobutene), SOG (Spin-on-glass) or other low-k dielectric materials, and can be removed by technological means, so as to realize spatial separation with the heavily doped ohmic contact layer by utilizing air.

Further, the material of the epitaxial structure includes but is not limited to III-V group compounds. For example, the above-mentioned first semiconductor layer can be understood as a channel layer, and the material of the first semiconductor layer can include GaN, etc. The above-mentioned second semiconductor layer can be understood as a barrier layer, and the material of the second semiconductor layer can include AlGaN, AlN, AlInN or AlInGaN, etc, especially heavily doped n-type GaN. The material of the above-mentioned insertion layer can include AlN, etc.

In some embodiments, the material of the dielectric layer includes $Al_2O_3$, $SiO_2$, $HfO_2$, AlON, silicon nitride and the like, or combinations thereof, such as $Al_2O_3$/AlN, $Al_2O_3$/$HfO_2$ and other composite gate electrode media, but is not limited thereto.

In some embodiments, the GaN electronic device structure includes an N-polar HEMT device structure or an HEMT device structure with a back barrier structure, but is not limited thereto.

In some embodiments, the high-electron-mobility transistor structure also includes a substrate where the epitaxial structure is formed. The material of the substrate includes but is not limited to silicon, sapphire, silicon carbide, gallium nitride, aluminum nitride, etc. In addition, the epitaxial structure can also include a nucleating layer, a buffer layer and the like which are grown on the substrate in turn, which is familiar in the art and will not be described in detail here.

In the above embodiments of the present application, a GaN electronic device structure with short channel, full gate electrode control, series resistance and no near access regions is formed by directly constructing a gate electrode (such as a T-type gate electrode) between the source electrode and the drain electrode, which can effectively reduce the knee voltage of the device and improve the linearity of the device. Moreover, the GaN electronic device structure is completely suitable for depletion-mode and enhancement-mode HEMT devices. In particular, when a thin barrier-based heterojunction epitaxial structure is adopted, the enhanced device can be realized without a groove gate etching process. Meanwhile, the device has large transconductance, which is conducive to significantly improving the PA power gain of the device.

Some embodiments of the present application further provide a fabricating method of a high-electron-mobility transistor structure, comprising:

a step of fabricating an epitaxial structure, the epitaxial structure comprising a heterojunction comprising a first semiconductor layer and a second semiconductor layer, and a carrier channel being formed between the first semiconductor layer and the second semiconductor layer, and a step of fabricating a source electrode, a drain electrode and a gate electrode which are matched with the epitaxial structure, the source electrode being electrically connected with the drain electrode through the carrier channel;

wherein, the step of fabricating the gate electrode comprises: the size of the gate foot of the gate electrode is set to meet the following conditions: a coincidence rate between the orthographic projection of the gate foot of the gate electrode on the first semiconductor layer and the orthographic projection of the second semiconductor layer on the first semiconductor layer is more than 80%, preferably more than 90%, preferably more than 95%, preferably more than 99%, especially preferably 100%. That is, the orthographic projection of the gate foot on the first semiconductor layer almost covers the orthographic projection of the second semiconductor layer on the first semiconductor layer.

In some embodiments, the fabricating method specifically comprises:

successively growing a first semiconductor layer and a second semiconductor layer on a substrate;

arranging a mask on the gate electrode region of the second semiconductor layer, wherein the radial size of the mask is consistent to that of the gate foot;

etching to remove the region of the second semiconductor layer that is not protected by the mask, wherein the etching depth is a depth of reaching the surface of the first semiconductor layer or entering the first semiconductor layer;

at least growing ohmic contact layers on the source electrode region and the drain electrode region of the first semiconductor layer, and allowing the height of the surface of the second semiconductor layer to be below the height of the surface of the ohmic contact layer, and contacting the ohmic contact layer with the carrier channel;

fabricating a gate electrode on the second semiconductor layer after the mask is removed, and respectively fabricating the source electrode and the drain electrode on the source electrode region and the drain electrode region of the ohmic contact layer, and allowing the source electrode and the drain electrode to form ohmic contact with the ohmic contact layer;

more preferably, the ohmic contact layer and the carrier channel form ohmic contact.

In some embodiments, the fabricating method further comprises: growing an ohmic contact layer on a region of the surface of the first semiconductor layer that is not covered by the second semiconductor layer, and allowing the surface of the ohmic contact layer to be higher than that of the surface of the second semiconductor layer, so as to form a groove in the ohmic contact layer, then removing the mask and fabricating the gate electrode, and at least allowing the bottom of the gate foot to be distributed in the groove.

In some embodiments, the fabricating method further comprises: after the ohmic contact layer is grown, removing the mask and then forming a continuous dielectric layer on the ohmic contact layer and the second semiconductor layer, then fabricating the gate electrode on the dielectric layer, and forming a window on the dielectric layer, and fabricating the source electrode and the drain electrode in the window.

Where, a process of fabricating the gate electrode can be carried out before or after a process of fabricating the source electrode and the drain electrode.

In some embodiments, the fabricating method further comprises: after the ohmic contact layer is grown, fabricating the source electrode and the drain electrode on the ohmic contact layer, then forming a continuous sacrificial layer on the ohmic contact layer, and embedding the source electrode and the drain electrode into the sacrificial layer, and at least allowing the surface of the mask to be exposed out of the sacrificial layer, then removing the mask layer, and fabricating the gate electrode on the second semiconductor layer;

where, all the source electrode, the drain electrode and the mask can be completely embedded in the sacrificial layer, and then the mask part can be exposed out of the sacrificial layer through polishing (such as CMP, chemical mechanical polishing) and other processes.

After the fabrication of the source electrode, drain electrode and gate electrode is completed, the sacrificial layer can be removed, so as to realize spatial isolation from the heavily doped ohmic contact layer by utilizing air, or the sacrificial layer can be retained and used as a support layer for the gate electrode and the like.

In some embodiments, the fabricating method specifically comprises: arranging the mask on the gate electrode region of the second semiconductor layer, and at least forming the dielectric layer on the side wall of the mask, then successively etching the second semiconductor layer and growing the ohmic contact layer on the first semiconductor layer.

In some embodiments, the fabricating method further comprises: performing an operation of active region isolation on the epitaxial structure, wherein such the operation can be implemented according to well-known modes in the art.

In some embodiments, the gate electrode includes a gate foot and a gate cap which are sequentially distributed in a direction away from the second semiconductor layer, wherein the radial size of the gate foot is smaller than or equal to that of the gate cap. Preferably, the gate electrode includes a T-type gate, but is not limited thereto.

In the above embodiments of the present application, the mask can be formed by a photoresist or a dielectric film, and can be graphically processed by exposure, developing and other methods that are familiar in the art, and can also be removed by wet etching and other modes that are familiar in the art.

In the above embodiments of the present application, each structural layer in the epitaxial structure can be grown by metal organic vapor deposition (MOCVD), atomic layer deposition (ALD), plasma enhanced chemical vapor deposition (PECVD) and other physical and/or chemical vapor deposition methods that are familiar in the art.

In the above embodiments of the present application, the dielectric layer can be fabricated by ALD or other physical and chemical vapor deposition methods.

In the above embodiments of the present application, the source electrode, the drain electrode and the gate electrode can be formed by sputtering, evaporation and other methods that are known in the art and a metal stripping technology.

In preferred embodiments of the present application, the above-mentioned GaN electronic device structure is fabricated by using thin barrier heterostructure-based GaN HEMT epitaxial structure and by virtue of secondary epitaxial growth ohm technology, which can be defined as a near-full gate controlled short channel device. This GaN electronic device structure can simultaneously realize a low knee voltage and an enhanced operation mode, thus meeting the RF front-end PA application scenarios. Compared with the existing GaN RFHEMT, this GaN electronic device structure has no gate-source access regions and gate-drain access regions, and the entire short channel is effectively regulated by the gate electrode, thereby eliminating the nonlinear effect induced by $R_{GS}$ resistance degradation on the basis of achieving speed saturation. In particular, in the aspect of implementing the enhanced working mode, since the epitaxial structure of this GaN electronic device structure uses a thin barrier and does not require dry etching and other processes, thus avoiding the etching damage of the existing groove gate enhanced HEMT device during the fabricating so as to greatly improve the fabricating reliability and stability of the device; in the aspect of suppressing the parasitic effect, the high-frequency parasitic effect can be greatly suppressed due to the T-type gate structure that realizes spatial isolation from the heavily doped ohmic contact layer by utilizing air. Meanwhile, the thin barrier means a large gate capacitance, which is helpful to greatly improve the transconductance of this GaN electronic device structure, thus ultimately improving the power gain of PA.

Some embodiments of the present application also provide the use of the GaN electronic device structure in fabricating power amplifiers, radio frequency devices, communication devices or electronic devices. Further, the power amplifier can be a RF wave band power amplifier, or a millimeter wave band power amplifier, a terahertz wave band power amplifier, etc., and is not limited thereto. The electronic devices can be mobile phones, tablet computers or other smart devices, and are not limited thereto.

Another aspect of the present application also provides a high-electron-mobility transistor structure, including an epitaxial structure, and a source electrode, a drain electrode and a gate electrode which are matched with the epitaxial structure. The epitaxial structure includes a heterojunction where a carrier channel is formed, and the carrier channel is distributed in a region covered by the orthographic projection of the gate electrode on the epitaxial structure; wherein, the epitaxial structure also includes a heavily doped region and a high resistance region. The heavily doped region is arranged on the heterojunction and forms ohmic contact with the carrier channel. Both the source electrode and the drain electrode form ohmic contact with the heavily doped region. The high resistance region is arranged on the heavily doped region, and the source electrode is isolated from the gate electrode by the high resistance region, and the drain electrode is isolated from the gate electrode by the high resistance region.

It should be noted that the heavily doped region and high resistance region can be considered as the highly doped ohmic contact layer.

In some embodiments, the upper surface of the heavily doped region is higher than the surface of the carrier channel.

Where, the material of the heavily doped region can be GaN, or a combination of any one or more of InGaN, AlInGaN or AlGaN, and is not limited thereto. The material of the high resistance region can be GaN, or a combination of any one or more s of SiN, AlN, InGaN, AlInGaN or AlGaN, but is not limited thereto.

In some embodiments, the heterojunction is mainly composed of a first semiconductor layer and a second semiconductor layer arranged on the first semiconductor layer. The heavily doped region includes a first heavily doped region matched with the source electrode and a second heavily doped region matched with the drain electrode. The first heavily doped region and the second heavily doped region are respectively located at both sides of the second semiconductor layer, and the high resistance region includes a first high resistance region matched with the source electrode and a second high resistance region matched with the drain electrode. The at least local regions of the source electrode and the drain electrode pass through the first high resistance region and the second high resistance region and then form ohmic contact with the first heavily doped region and the second heavily doped region. The first heavily doped region and the first high resistance region jointly constitute the source electrode contact region of the high-electron-mobility transistor structure, and the second heavily doped region and the second high resistance region jointly constitute the drain electrode contact region of the high-electron-mobility transistor structure.

Where, the first semiconductor layer is the first semiconductor layer of the high-electron-mobility transistor structure, the thickness of the first semiconductor layer is 5-200 nm, and the material of the first semiconductor layer can be a GaN material; the second semiconductor layer is the second semiconductor layer of the high-electron-mobility transistor structure. The thickness of the second semiconductor layer is 1-100 nm, and the material of the second semiconductor layer can be a combination of any one or more of AlGaN-based, AlN-based, AlInN-based and AlInGaN-based materials, but is not limited thereto.

In some embodiments, the carrier channel can be a two-dimensional electron gas channel, and the heavily doped region is of n type; or, the carrier channel is a two-dimensional hole gas channel, and the heavily doped region is of p type.

In some embodiments, the material of the epitaxial structure can be a Ga polar surface or an N polar surface. A device structure with the two-dimensional electron gas channel, which is fabricated on the Ga polar surface, is consistent with a device structure with a two-dimensional hole gas channel, which is fabricated on the N-polar surface. The device structure with the two-dimensional hole gas channel, which is fabricated on the Ga polar surface is consistent with device structure with the two-dimensional electron gas channel, which is fabricated on the N-polar surface.

In some embodiments, the first semiconductor layer includes a first region and a second region, a bulge portion is formed on the first region, the second semiconductor layer is arranged on the bulge portion, the first heavily doped region and the second heavily doped region are arranged on the second region and distributed at both sides of the bulge portion.

In some embodiments, the epitaxial structure further includes a cap layer arranged on the second semiconductor layer. The thickness of the cap layer is 0-100 nm. The material of the cap layer can be a GaN material and SiN, but are not limited thereto.

In some embodiments, the epitaxial structure further includes an insertion layer distributed between the first semiconductor layer and the second semiconductor layer. The thickness of the insertion layer is 0-10 nm, and the material of the insertion layer can be an AlN material, but is not limited thereto.

In some embodiments, the epitaxial structure further includes a buffer layer distributed between the substrate and the first semiconductor layer.

In some embodiments, the buffer layer can be selectively doped.

In some embodiments, the epitaxial structure further includes a back barrier layer distributed between the buffer layer and the first semiconductor layer. The material of the back barrier layer can be AlN and AlGaN, but is not limited thereto.

In some embodiments, the gate electrode can be a T-type gate, which includes a gate cap and a gate foot which are arranged in an axial direction, wherein the gate cap is arranged on the high resistance region and supported by the high resistance region, the gate foot is arranged in the epitaxial structure, the size of the gate cap in a source-drain channel direction is larger than that of the gate foot in the source-drain channel direction, and the carrier channel is distributed right below the gate foot, and the size of the gate foot in the source-drain channel direction is smaller than or equal to the length of the two-dimensional electron gas channel.

In some preferred embodiments, a side wall dielectric layer is also arranged between the side wall of the gate foot and the high resistance region, and the material of the side wall dielectric layer can be SiN. The method for forming the side wall dielectric layer can be a low pressure chemical vapor deposition (LPCVD) method, but is not limited thereto.

In some embodiments, a dielectric layer is also arranged between the gate electrode and the heterojunction. The material of the dielectric layer can be one or more of $SiO_2$, $HfO_2$, $Al_2O_3$, AlN, AlON and SiN. The method for forming the dielectric layer can be the ALD method, and is not limited thereto.

In some embodiments, the dielectric layer also extends to cover the surface of the epitaxial structure, and the source electrode and the drain electrode are matched with the epitaxial structure through the corresponding window formed on the dielectric layer.

In some embodiments, the dielectric layer is also used for obstructing the gate electrode and the high resistance region, or the gate electrode is directly isolated from the high resistance region by air.

In some embodiments, the high resistance region can be epitaxially formed on the heavily doped region in a secondary epitaxy mode, or be formed by local transformation of the heavily doped region. For example, the heavily doped region material can be transformed into high resistance material through thermal diffusion, ion injection, plasma treatment and other methods, or by any other ways that can form the high resistance material layer.

In the above embodiments, an interface between the heavily doped region and the high resistance region can be controlled by mutation doping or gradual doping as long as it is ensured that the surface of the heavily doped region is higher than the surface of the carrier channel.

In some embodiments, the high-electron-mobility transistor structure also includes an isolation region which is formed in the epitaxial structure and used for isolating the active region of the high-electron-mobility transistor structure. The isolation region is distributed at both sides of the epitaxial structure, which at least extends from the surface of the epitaxial structure below the first semiconductor layer in the axial direction.

In some embodiments, the isolation region can be formed by an N ion injection technology, with an injection energy being 100-400 keV and an N ion injection dose being $10^{12}$-$10^{17}$/cm$^2$, and the injection depth is below the first semiconductor layer. The isolation region can adopt the etching method to etch the epitaxial layer of the active region below the first semiconductor layer.

Another aspect of the present application also provides a fabricating method of a high-electron-mobility transistor structure, including:

successively arranging a first semiconductor layer and a second semiconductor layer to form a heterojunction, and allowing the carrier channel to be distributed in a region covered by the orthographic projection of the gate electrode on the epitaxial structure;

fabricating a heavily doped region and a high resistance region on the heterojunction, and arranging the high resistance region on the heavily doped region, and allowing the heavily doped region to form ohmic contact with the carrier channel, thus forming an epitaxial structure; and fabricating a source electrode, a drain electrode and a gate electrode which are matched with the epitaxial structure, and allowing the source electrode and the drain electrode to form ohmic contact with the heavily doped region, and isolating the source electrode from the gate electrode by the high resistance region and isolating the drain electrode from the gate electrode by the high resistance region.

Further, the fabricating method specifically comprises:

successively growing a first semiconductor layer and a second semiconductor layer on a substrate in turn;

arranging a mask on a region of the surface of the second semiconductor layer corresponding to the gate electrode, etching the second semiconductor layer and the first semiconductor layer by using the mask until both the source electrode contact region and the drain electrode contact region of the second semiconductor layer are completely removed, and both the source electrode contact region and the drain electrode contact region of the first semiconducting layer are partially removed, so that the region of the first semiconductor layer corresponding to the gate electrode is formed into a bulge portion, and the rest part of the second semiconductor layer is distributed on the bulge portion;

growing a heavily doped layer on the rest part of the source electrode contact region and the drain electrode contact region of the first semiconductor layer to form a heavily doped region, and allowing the surface of the heavily doped region to be higher than the surface of the carrier channel, and then growing a high resistance layer on the heavily doped layer to form a high resistance region, thus forming the epitaxial structure, or, growing a heavily doped layer on the rest part of the source electrode contact region and the drain electrode contact region of the first semiconductor layer, and then transforming the semiconductor material at a specified depth from the surface of the heavily doped layer to the inside of the heavily doped layer into a high resistance material, so as to form a high resistance region and a heavily doped region in the heavily doped layer, wherein the specified depth is higher than the surface of the carrier channel, thus forming the epitaxial structure;

removing the mask, and fabricating the gate electrode, the source electrode and the drain electrode.

In some embodiments, the materials of the source electrode and the drain electrode can be Ti/Al/Ni/Au, or other metal systems that can form ohmic contact with n-type or p-type heavily doped regions; the material of the gate electrode can be Ni/Au, or a material system which can form Schottky contact with the second semiconductor layer, such as Ni/Pt/Au, Ni/Pt and P—GaN.

In some embodiments, the fabricating method specifically further includes: forming a dielectric layer between the gate electrode and the heterojunction.

In some embodiments, the fabricating method specifically further includes: forming a side wall dielectric layer between the gate foot of the gate electrode and the high resistance region.

It should be noted that under the condition that the growth shape of the ohmic contact region composed of the high resistance region and the heavily doped region can be regulated, the dielectric layer or the side wall dielectric layer cannot be formed as well.

In some embodiments, the fabricating method specifically further includes: forming a buffer layer between the substrate and the first semiconductor layer.

In some embodiments, the material of the substrate can be selected from any one of silicon, sapphire, silicon carbide, gallium nitride and aluminum nitride, and is not limited thereto.

In some more specific embodiments, the fabricating method can include the following steps:

Step 1), the buffer layer, the first semiconductor layer, the insertion layer, the second semiconductor layer and the cap layer are successively epitaxially grown on the substrate, and the carrier channel is formed under the surface of the first semiconductor layer close to the insertion layer;

Step 2), the size of the gate foot of the T-type gate is defined on the epitaxial structure through an electronic photoresist, that is, the gate length $L_G \approx$50-500 nm;

Step 3), the electronic photoresist is cured by an annealing process, wherein the annealing temperature is about 400° C.;

Step 4), a layer of side wall dielectric layer is deposited on the surface of the device formed in Step 3), and then the side wall dielectric layers are etched away on the cap layer and the upper surface of the electronic photoresist by using a self-aligned etching technology;

Step 5), the source electrode contact region and the drain electrode contact region are etched based on the cured electronic photoresist as the mask, and the cap layer, the second semiconductor layers, the insertion layers and a part thickness of first semiconductor layers of the source electrode contact region and the drain electrode contact region are removed;

Step 6), the heavily doped layer is epitaxially grown in the source electrode contact region and the drain electrode contact region which are subjected to etching by continuing to use the cured electronic photoresist as the mask to form a heavily doped region, the thickness and doping concentration of the heavily doped region ensure that the heavily doped region forms good ohmic contact with the carrier channel, and then a high resistance layer is epitaxially grown on the heavily doped region to form a high resistance region;

Step 7), the electronic photoresist is removed;

Step 8), the isolation region of the active region is formed at both sides of the epitaxial structure;

Step 9), a dielectric layer is deposited on the device surface formed in Step 8);

Step 10), the T-type gate is fabricated by using the high resistance layer as the support layer of the T-type gate cap;

Step 11), a window is formed on the gate dielectric layer and the high resistance layer, and a source electrode and a drain electrode are fabricated in the window, so that the source electrode and the drain electrode form ohmic contact with the heavily doped layer.

In other more specific embodiments, in Step 6), the cured electronic photoresist is used as the mask, the heavily doped layer is epitaxially grown in the source electrode contact region and the drain electrode contact region which are subjected to etching to form the heavily doped region, the thickness and doping concentration of the heavily doped region ensure that the heavily doped region forms good ohmic contact with the carrier channel, and then the semiconductor material at the specified depth from the surface of the heavily doped layer to the inside of the heavily doped layer is transformed into the high resistance material, thus forming the high resistance region and the heavily doped region in the heavily doped layer, and the specified depth is higher than the surface of the carrier channel.

Another aspect of the present application further provides a power amplifier, including the high-electron-mobility transistor structure.

In some embodiments, the power amplifier includes radio frequency wave band power amplifier, a millimeter wave band power amplifier or a terahertz wave band power amplifier, etc.

Next, the technical solution of the present application will be described clearly and completely in combination with the attached drawings and specific embodiments. Obviously, the described embodiments are parts of the embodiments of the present application, not all the embodiments. Based on the embodiments in the present application, other embodiments obtained by persons of ordinary skill in the art without creative efforts are all included within the scope of protection in the present application. And, unless otherwise specified, the fabricating processes involved in the following embodiments of the present application are all the existing processes in the field, and the process parameters are not specifically defined here.

Figure 2:
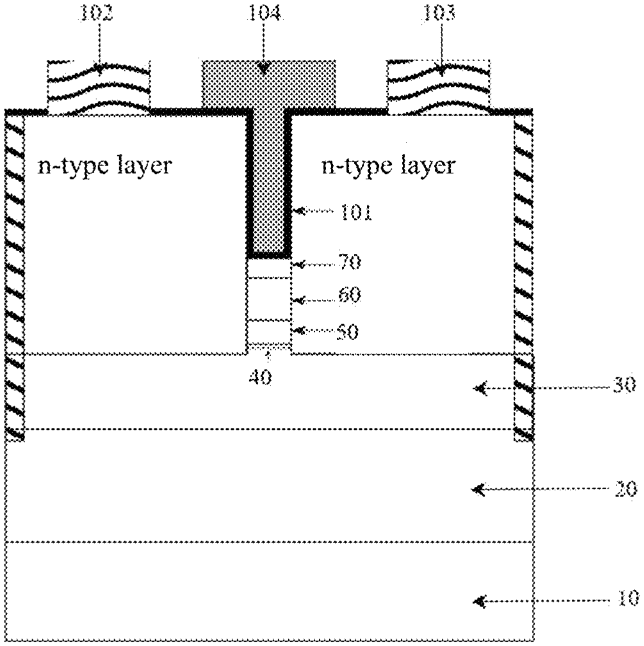
FIG. 2 is a structural diagram of a near-full gate controlled GaN RFHEMT provided in a typical example of the present application.

Referring to FIG. 2, a GaN electronic device structure in a typical embodiment of the present application is a near-full gate controlled GaN HEMT structure, including a buffer layer 20, a channel layer 30, an insertion layer 50, a barrier layer 60, a cap layer 70 and the like which are successively grown on a substrate 10, and an n-type layer (i.e., the above-mentioned ohmic contact layer) is also grown on the surface of the channel layer 30, and the n-type layer is also in contact with the insertion layer 50, the barrier layer 60, the cap layer 70 and the like, so as to form an epitaxial structure, the channel layer 30, the insertion layer 50 and the barrier layer 60 form a heterojunction, and a two-dimensional electron gas channel 40 is formed between the channel layer 30 and the insertion layer 50.

In this embodiment, a groove is formed in this n-type layer. The insertion layer 50, the barrier layer 60 and the cap layer 70 are all distributed in the groove. Where, the gate electrode 104 is a T-type gate, and the gate foot of the gate electrode is also arranged in the groove. The gate cap is arranged on the n-type layer. The source electrode 102 and the drain electrode 103 are formed on the n-type layer and form ohmic contact with the n-type layer.

This epitaxial structure can also have an active region isolation structure formed by ion injection and other methods. Meanwhile, a continuous dielectric layer 101 can be formed between the n-type layer and the cap layer 70 and the gate electrode 104, thus forming an enhanced device.

In this embodiment, this epitaxial structure preferably adopts a thin barrier design. Through such the design, on the one hand, short channel devices can be fabricated, and the entire channel is almost effectively controlled by the gate electrode (that is, the gate length $L_G$≈source-drain spacing $L_{DS}$). Because there are no gate-source access regions and gate-drain access regions, the linearity degeneration problem of the device caused by $R_{GS}$ high-field non-linear behavior can be effectively suppressed while significantly reducing the difficulty of obtaining the low knee voltage of the device; on the other hand, since the thin barrier epitaxial structure is adopted and the gate electrode can perform electron concentration regulation on the entire channel, the enhanced device can be fabricated without the help of a complex technology. Meanwhile, the thin barrier means the large gate capacitance, which is conducive to improving the transconductance of the device so as to ultimately improve the PA power gain.

Figure 5:
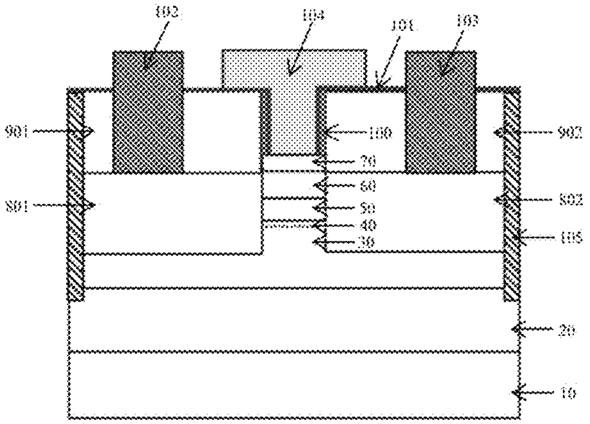
FIG. 5 is a structural diagram of a high-electron-mobility transistor provided in a typical example of the present application.

Referring to FIG. 5, an n-type channel high-electron-mobility transistor structure provided by the embodiment of the present application includes a substrate 10, an epitaxial structure formed on the substrate 10, and a source electrode 102, a drain electrode 103 and a gate electrode 104 which are matched with the epitaxial structure. The epitaxial structure includes a GaN buffer layer 20, a GaN first semiconductor layer 30, an AlN insertion layer 50, an AlGaN second semiconductor layer 60 and a GaN cap layer 70 which are successively formed on the sapphire substrate 10, and the GaN first semiconductor layer 30 includes a first region and a second region. The bulge portion is formed on the first region. The AlN insertion layer 50, the AlGaN second semiconductor layer 60 and the GaN cap layer 70 are successively arranged on the bulge portion i, wherein the GaN first semiconductor layer 30, the AlN insertion layer 50 and the AlGaN second semiconductor layer 60 form a heterojunction, and a two-dimensional electron gas channel 40 is formed under the surface of the GaN first semiconductor layer 30 close to the AlN insertion layer 50, and this two-dimensional electron gas channel 40 is distributed in a region covered by the orthographic projection of the gate electrode 104 on the epitaxial structure.

Further, the epitaxial structure further includes a heavily doped region and a high resistance region. The heavily doped region includes a first heavily doped region 801 which is matched with the source electrode 102 and a second heavily doped region 802 which is matched with the drain electrode 103. The first heavily doped region 801 and the second heavily doped region 802 are arranged on the second region of the GaN second semiconductor layer 30 and form good ohmic contact with the two-dimensional electron gas channel 40, the high resistance region includes a first high resistance region 901 which is matched with the source electrode 102 and a second high resistance region 902 which is matched with the drain electrode 103. The local regions of the source electrode 102 and the drain electrode 103 pass through the first high resistance region 901 and the second high resistance region 902 and then respectively form ohmic contact with the first heavily doped region 801 and the second heavily doped region 802, and the source electrode 102 is isolated from the gate electrode 104 by the first high resistance region 901, the drain electrode 103 is isolated from the gate electrode 104 by the second high resistance region 902, and the surfaces of the first heavily doped region 801 and the second heavily doped region 802 are higher than the surface of the two-dimensional electron gas channel 40.

Where, the first heavily doped region 801 and the second heavily doped region 802 are n-type heavily doped GaN materials, and the first high resistance region 901 and the second high resistance region 902 are high resistance GaN materials.

Specifically, the gate electrode 104 is a T-type gate, which includes a gate cap and a gate foot which are arranged in the axial direction, wherein the two ends of the gate cap are respectively arranged on the first high resistance region 901 and the second high resistance region 902 and supported by the first high resistance region 901 and the second high resistance region 902, and the gate foot is arranged in the epitaxial structure, the diameter of the gate cap is greater than that of the gate foot, and the two-dimensional electronic gas channel 40 is distributed right below the gate foot, and the diameter of the gate foot is greater than or equal to the length of the two-dimensional electron gas channel 40, so as to achieve a near-full gate controlled high-electron-mobility transistor structure.

Specifically, SiN side wall dielectric layers 100 are also arranged between the gate foot of the gate electrode 104 and the first high resistance region 901 and between the gate foot of the gate electrode 104 and the second high resistance region 902, and a $Al_2O_3$ dielectric layer 101 is also arranged between the gate electrode 104 and the surface of the epitaxial structure.

Figure 6:
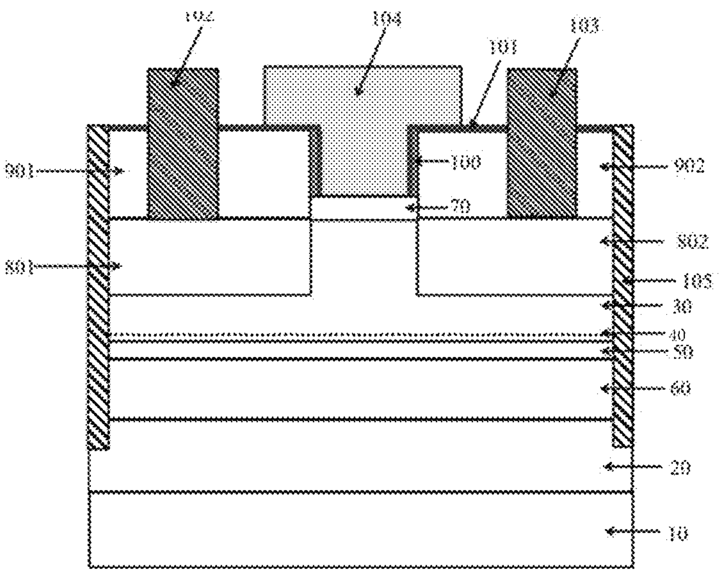
FIG. 6 is a structural diagram of another high-electron-mobility transistor provided in a typical example of the present application.

Next, referring to FIG. 6. The n-type channel high-electron-mobility transistor structure with an N polar surface provided by the embodiment of the present application is different from the n-type channel high-electron-mobility transistor structure shown in FIG. 5 in that the two-dimensional electron gas channel 40 is formed on the surface of the GaN first semiconductor layer 30 close to the AlN insertion layer 50, and the AlGaN second semiconductor layer 60 is arranged below the GaN first semiconductor layer 30.

Next, the technical solution of the present application will be further described in detail in combination with embodiments and accompanying drawings. These embodiments are implemented on the premise of the technical solution of the present application, and the detailed embodiments and specific operation processes are given, however, the protection scope of the present application is not limited to the following examples.

Example 1

Figure 3A:
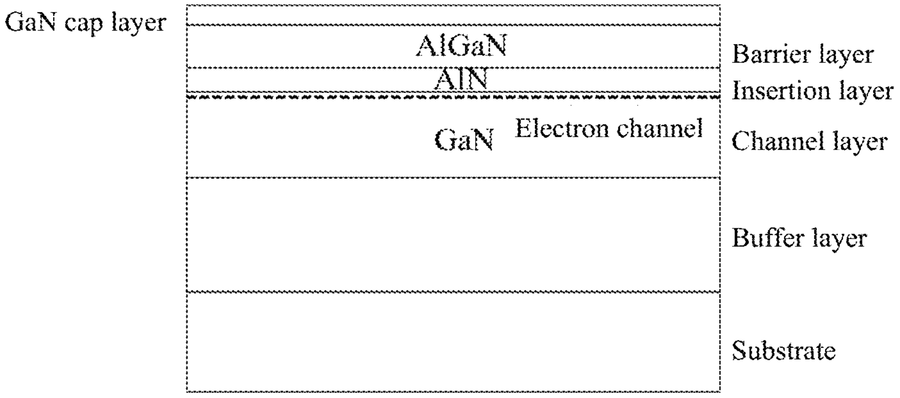
FIG. 3A is a diagram of a Ga HEMT epitaxial structure provided in example 1 of the present application.

A GaN HEMT structure (hereinafter called a device for short) provided in this example is basically the same as a GaN electronic device structure as shown in FIG. 1, wherein an ohmic contact layer formed by directly utilizing secondary epitaxy is used as a T-type gate support layer. A fabricating method of this device can include the following steps:

S1, epitaxial structures of a device based on a thin second semiconductor layer heterojunction were epitaxially grown through metal organic chemical vapor deposition (MOCVD), as shown in FIG. 3A. In one of the epitaxial structures, a second semiconductor layer was $Al_{0.2}Ga_{0.8}N$ with a thickness of about 5 nm; a GaN cap layer was about 2 nm in thickness; an AlN insertion layer was about 1 nm in thickness; a GaN first semiconductor layer is 5-200 nm in thickness.

Figure 3B:
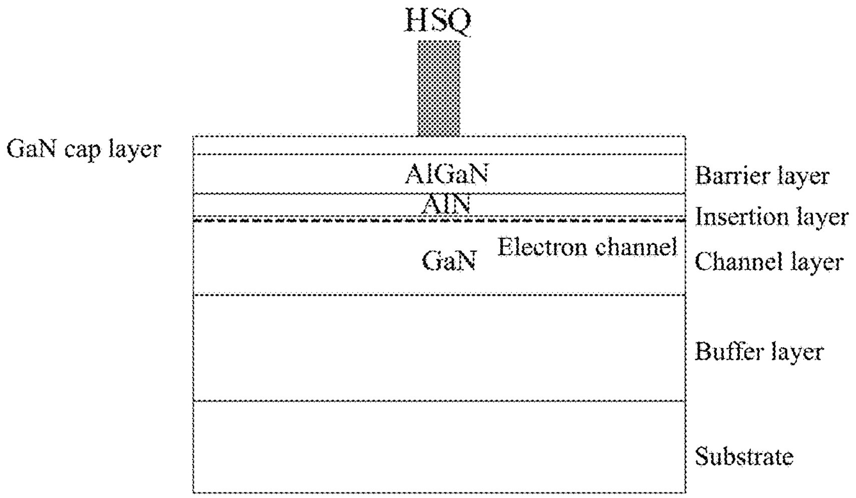
FIG. 3B is a diagram of a T-type gate foot size defined on an epitaxial structure as shown in FIG. 3A using HSQ electron photoresist in example 1 of the present application.

S2, the size, namely, the gate electrode length IG, of the gate foot of the T-type gate electrode (called "T-type gate" for short) of the device was defined by using hydrogen silsesquioxane (HSQ) electronic photoresist or other photoresists, as shown in FIG. 3B. For one of the T-type gates, the gate electrode length $L_G \approx 50$ nm-250 nm.

Figure 3C:
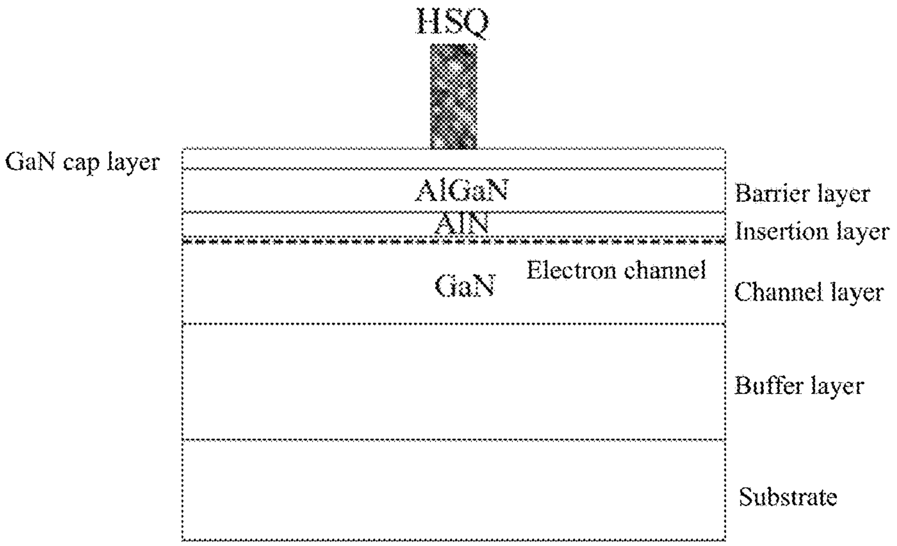
FIG. 3C is a diagram after an HSQ electronic photoresist as shown in FIG. 3A is annealed and cured in example 1 of the present application.

S3, the HSQ electronic photoresist was cured by using an annealing process, wherein the adopted annealing temperature was about 400° C., as shown in FIG. 3C.

Figure 3D:
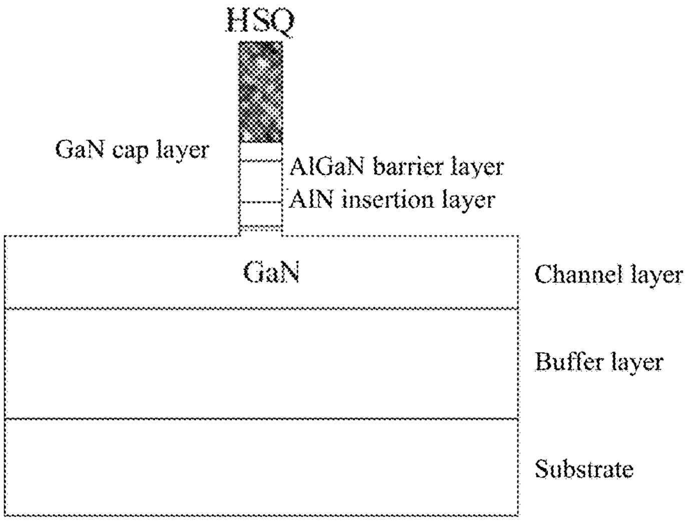
FIG. 3D is a diagram after a device structure as shown in FIG. 3C is subjected to source-drain ohmic contact region etching in example 1 of the present application.

S4, a source-drain ohmic contact region was etched. The gate electrode of the source-drain ohmic contact region was etched by adopting an inductive coupled plasma (ICP) etching technology and using the cured HSQ electronic photoresist as a mask, wherein the etching rate was controlled to 1-20 nm/min, as shown in FIG. 3D.

Figure 3E:
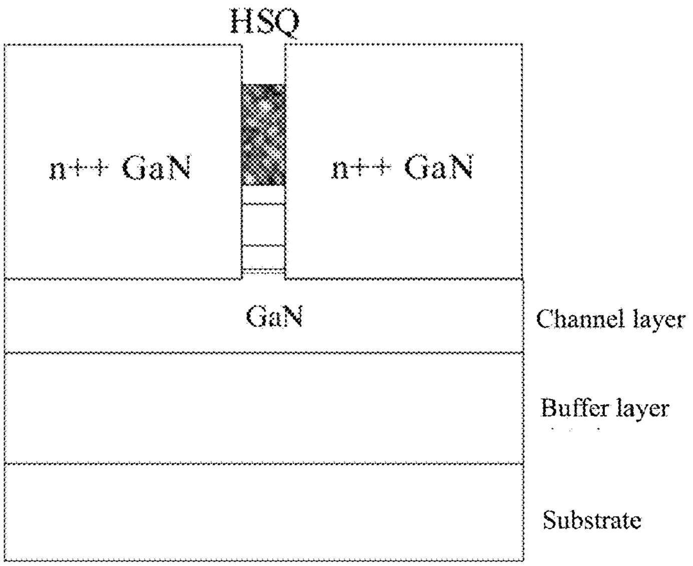
FIG. 3E is a diagram after a device structure as shown in FIG. 3D is subjected to secondary epitaxy of an ohmic contact layer in example 1 of the present application.

S5, the secondary epitaxy was performed on the ohmic contact layer. n-type heavily doped n++ GaN was subjected to epitaxial growth by adopting metal-organic vapor deposition (MOCVD) and using the cured HSQ electronic photoresist as the mask to form an ohmic contact layer, wherein the doping concentration and thickness ensured that the ohmic contact layer electrically formed good ohmic contact with the channel, as shown in FIG. 3E.

Figure 3F:
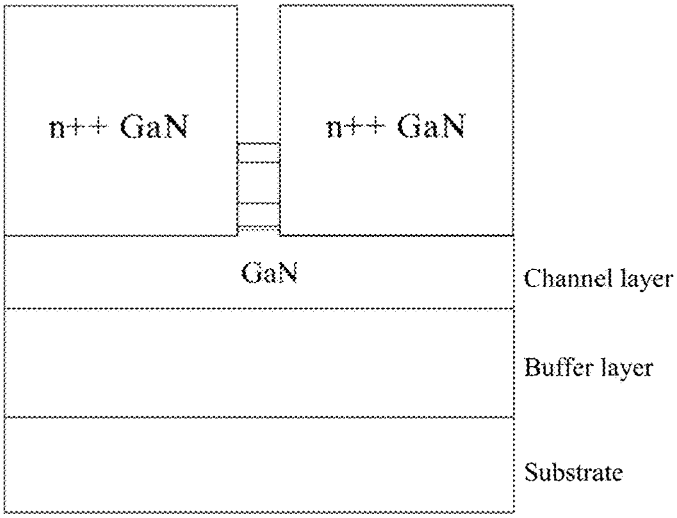
FIG. 3F is a diagram after an HSQ electronic photoresist cured on a device structure as shown in FIG. 3E is removed in example 1 of the present application.

S6, the HSQ electronic photoresist was removed. The HSQ electronic photoresist was removed by using a BOE solution (or HF solution), as shown in FIG. 3F.

Figure 3G:
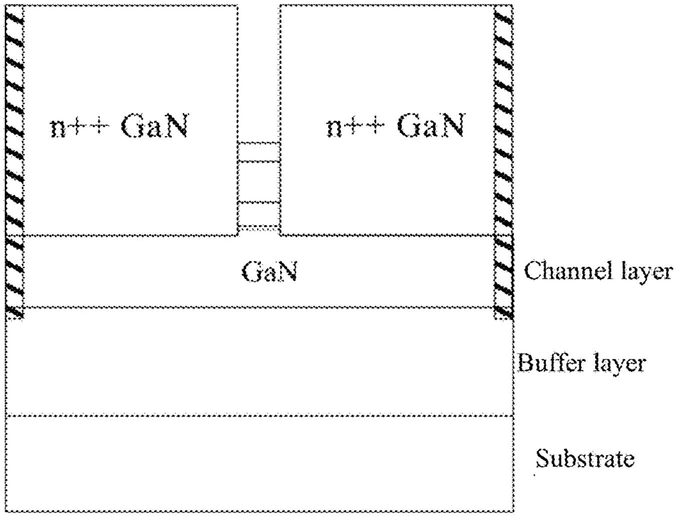
FIG. 3G is a diagram after a device structure as shown in FIG. 3F is subjected to active region isolation in example 1 of the present application.

S7, an active region was isolated. Isolation was performed by using an N ion injection technology, wherein the ion injection energy was 150-400 KeV ion injection, the ion injection dose was $10^{12}$-$10^{14}$/cm$^2$, and the injection depth exceeded a buffer layer by about 50-250 nm, as shown in FIG. 3G.

Figure 3H:
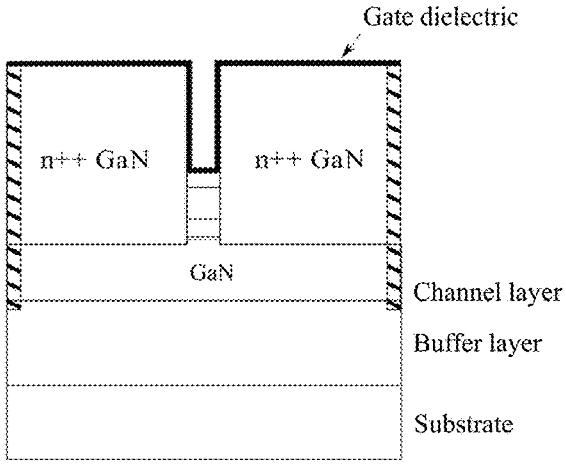
FIG. 3H is a diagram after a dielectric layer is deposited on a device structure as shown in FIG. 3G in example 1 of the present application.

S8, a gate electrode dielectric was deposited. A dielectric layer (called "gate dielectric" for short) was deposited by using an atom layer deposition (ALD) technology, wherein an $Al_2O_3$ dielectric layer has a thickness of 1-5 nm, as shown in FIG. 3H.

Figure 3I:
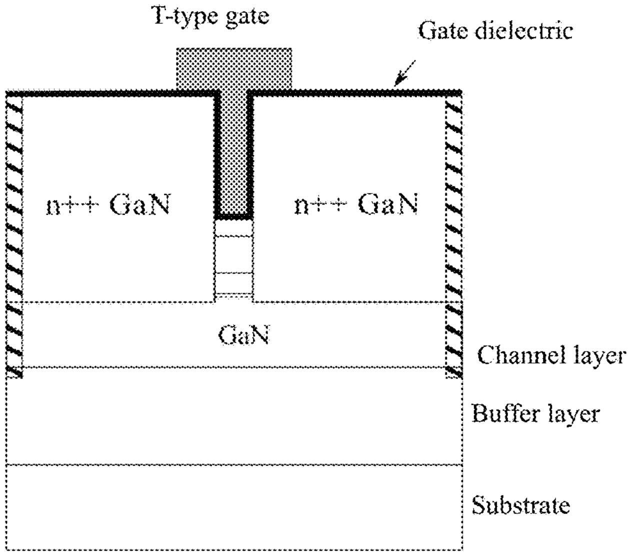
FIG. 3I is a diagram after a T-type gate is fabricated on a device structure as shown in FIG. 3H.

S9, a T-type gate electrode (called "T-type gate" for short) was fabricated. A Ni/AuT-type gate with a thickness of 50 nm/250 nm was fabricated by using secondary epitaxial ohmic contact layer as a T-type gate support layer and adopting a photoetching process and electronic beam evaporation technology, as shown in FIG. 3I.

Figure 3J:
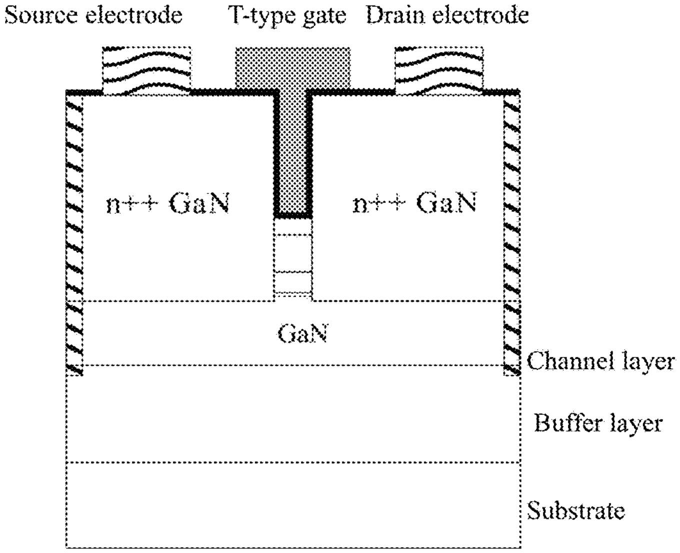
FIG. 3J is a diagram after a source electrode and a drain electrode are fabricated on a device structure as shown in FIG. 3I in example 1 of the present application.

S10, a source electrode and a drain electrode were fabricated. Via a source and drain ohmic contact windowing process, the source electrode and the drain electrode were fabricated by using an electron beam evaporation technology and formed ohmic contact with the ohmic contact layer. One of the source electrode and the drain electrode can be a Ti/Au ohmic contact electrode with a thickness of 50 nm/250 nm, as shown in FIG. 3J. The knee voltage of the GaN HEMT device in this example can reach 1V or less.

Example 2

A GaN HEMT structure (hereinafter called a device for short) provided in this example is basically the same as a GaN electronic device structure as shown in FIG. 1, wherein a dielectric sacrificial layer is used as a support layer of a T-type gate layer. A fabricating method of this device is similar to that in example 1 and can include the following steps:

S1-S3, S1-S3 are similar to steps S1-S3 in the fabricating method of the device in example 1, the gate foot of the T-type gate was defined by using the HSQ electronic photoresist and then annealed and cured, as shown in FIG. 3C.

Figure 4A:
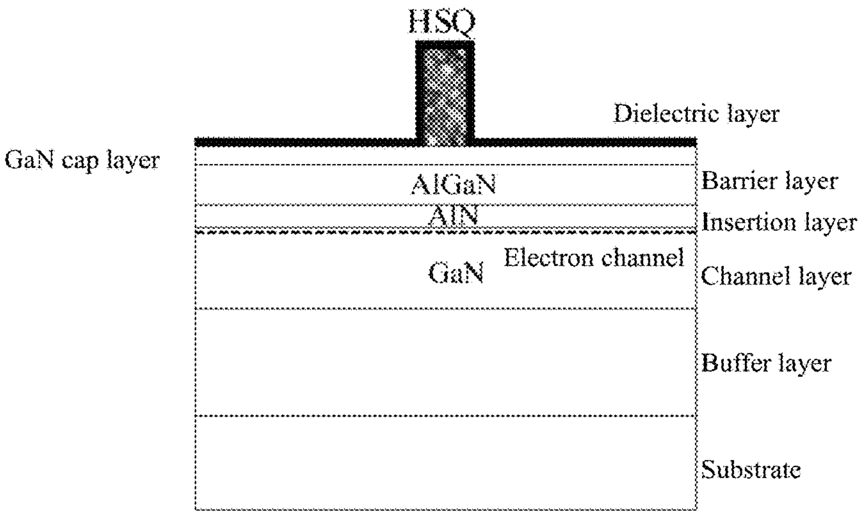
FIG. 4A is a diagram after a dielectric layer is deposited on a device structure as shown in FIG. 3C in example 2 of the present application.

S4, a dielectric layer was deposited. The dielectric layer was deposited by using an ALD technology. For example, a silicon nitride dielectric layer with a thickness of 1-5 nm can be deposited, as shown in FIG. 4A.

Figure 4B:
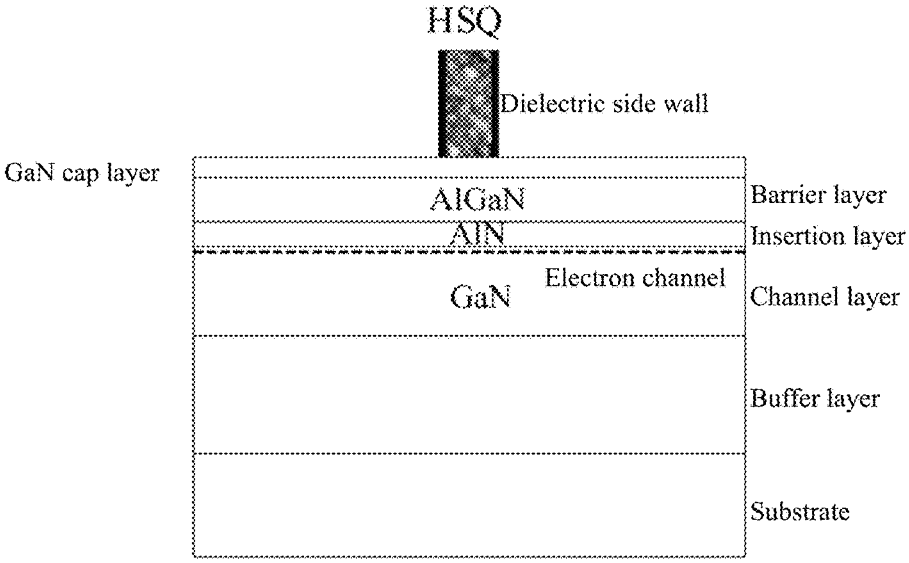
FIG. 4B is a diagram after a dielectric side wall is formed on a side wall of a cured HSQ electronic photoresist in FIG. 4A in example 2 of the present application.

S5, a dielectric side wall was formed. A silicon nitride dielectric layer was etched by reactive ion etch (RIE) so as to form the dielectric side wall, as shown in FIG. 4B. It is worth mentioning that, the role of the dielectric side wall is that on the one hand, the stability of the HSQ electronic photoresist in the subsequent process is maintained; on the other hand, short circuit between device electrodes is prevented.

Figure 4C:
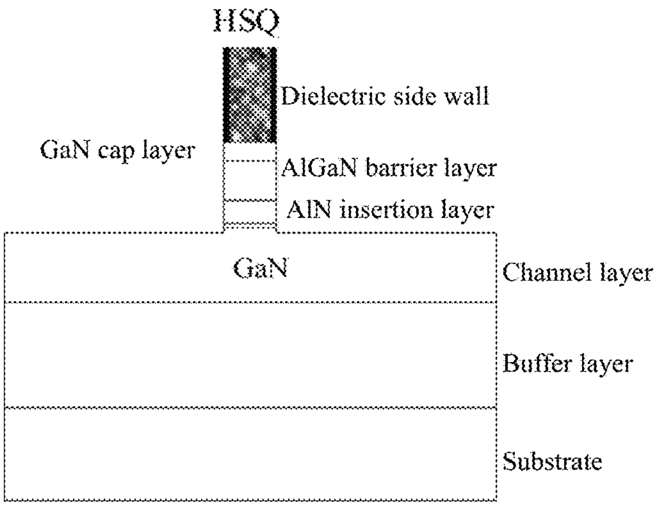
FIG. 4C is a diagram after a device structure shown in FIG. 4B is subjected to source-drain ohmic contact region etching in example 2 of the present application.

S6, a source-drain ohmic contact region was etched. The gate electrode of the source-drain ohmic contact region was etched by adopting an ICP etching technology and using the cured HSQ electronic photoresist as the mask, wherein the etching rate was controlled to 1-20 nm/min, as shown in FIG. 4C.

Figure 4D:
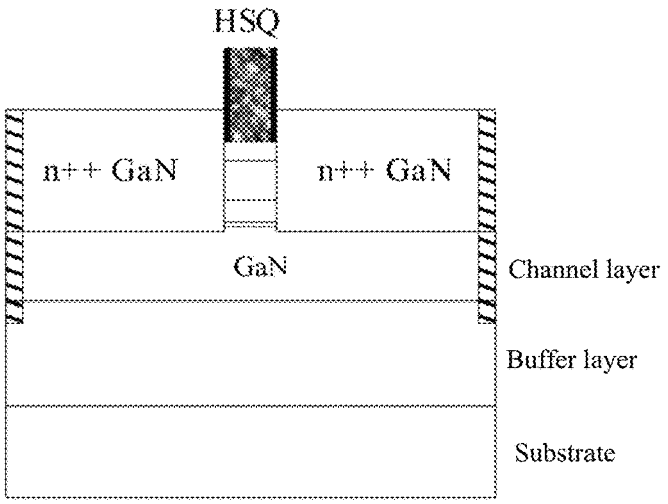
FIG. 4D is a diagram after a device structure as shown in FIG. 4C is subjected to secondary epitaxy of an ohmic contact layer in example 2 of the present application.

S7, the secondary epitaxy of the ohmic contact layer was performed. n-type heavily doped n++ GaN was subjected to epitaxial growth by adopting MOCVD and using the cured HSQ electronic photoresist as the mask to form an ohmic contact layer, wherein the doping concentration and thickness ensured that the ohmic contact layer formed good ohmic contact with the channel, as shown in FIG. 4D.

Figure 4E:
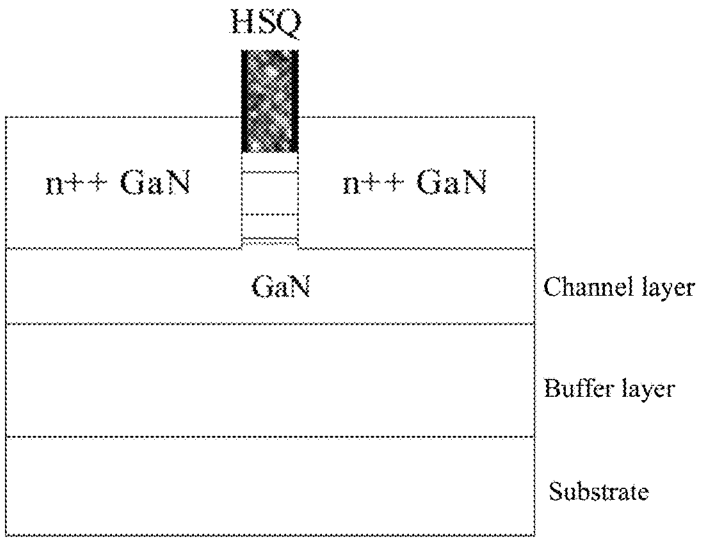
FIG. 4E is a diagram after a device structure shown in FIG. 4D is subjected to active region isolation in example 2 of the present application.

S8, an active region was isolated. Isolation was performed by using an N ion injection technology, wherein the ion injection energy was 150-400 KeV ion injection, the ion injection dose was $10^{12}$-$10^{14}$/cm$^2$, and the injection depth exceeded a buffer layer by about 50-250 nm, as shown in FIG. 4E.

Figure 4F:
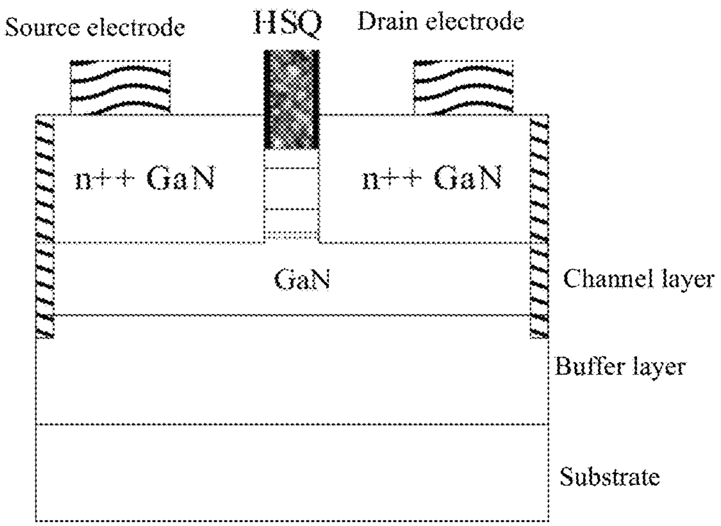
FIG. 4F is a diagram after a source electrode and a drain electrode are fabricated on a device structure as shown in FIG. 4E in example 2 of the present application.

S9, a source electrode and a drain electrode were fabricated. The source electrode and the drain electrode were fabricated by using an electron beam evaporation technology and formed ohmic contact with the ohmic contact layer. The source electrode and the drain electrode can be a Ti/Au ohm electrode with a thickness of 50 nm/250 nm, as shown in FIG. 4F.

Figure 4G:
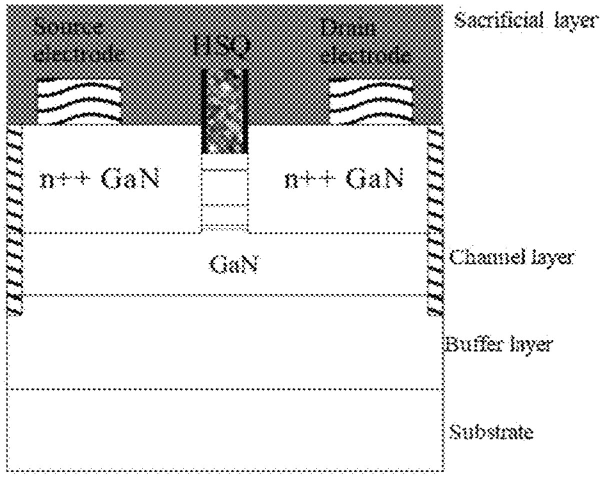
FIG. 4G is a diagram after a sacrificial layer is spin coated on a device structure shown in FIG. 4F in example 2 of the present application.

S10, a sacrificial layer was spin-coated. The sacrificial layer was spin-coated with polyimide (PI). The spin-coating thickness ensured that the surface of the wafer was covered with patterns (that is, at least higher than the heights of the HSQ electronic photoresist, and the source electrode and the drain electrode, as shown in FIG. 4G.

Figure 4H:
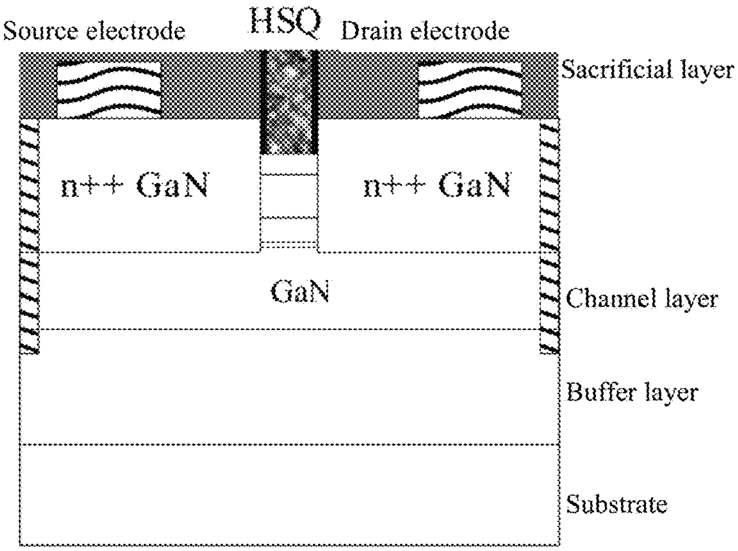
FIG. 4H is a diagram after CMP thinning is performed on the sacrificial layer on the device structure shown in FIG. 4G in example 2 of the present application.

S11, chemical mechanical polishing (CMP). The sacrificial layer was subjected to CMP treatment to expose the cured HSQ electronic photoresist, as shown in FIG. 4H.

Figure 4I:
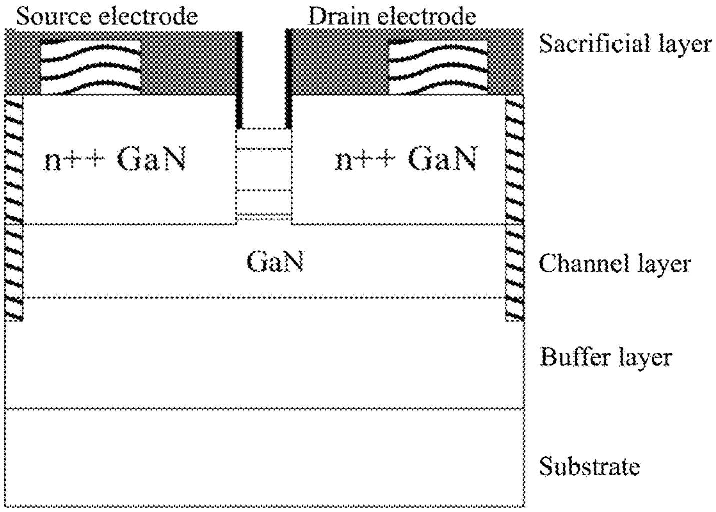
FIG. 4I is a diagram after an HSQ electronic photoresist on a device structure shown in FIG. 4G is removed in example 2 of the present application.

S12, the HSQ electronic photoresist was removed. The HSQ electronic photoresist was removed with BOE solution (or HF solution), as shown in FIG. 4I.

Figure 4J:
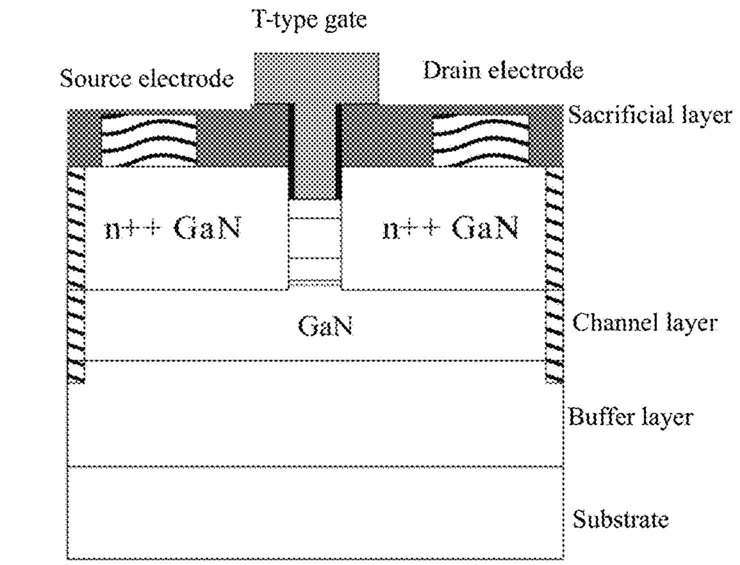
FIG. 4J is a diagram after agate electrode is deposited on a device structure shown in FIG. 4I in example 2 of the present application.

S13, a T-type gate was fabricated. A Ni/Au T-type gate with a thickness of 50 nm/250 nm was fabricated by using the sacrificial layer as the support layer and adopting a photoetching process and electron beam evaporation technology, as shown in FIG. 4J.

Figure 4K:
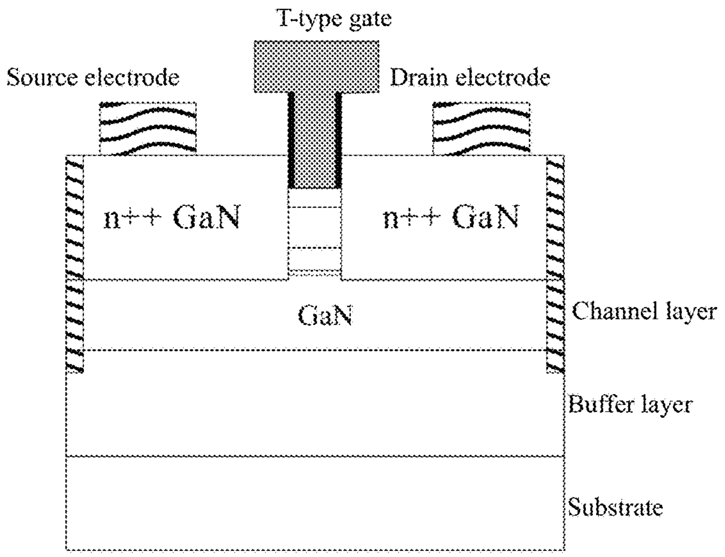
FIG. 4K is a diagram after a sacrificial layer on a device structure shown in FIG. 4J is removed in example 2 of the present application.

S14, the sacrificial layer was removed. The sacrificial layer was removed by using an organic solvent or plasma Ashing, so as to realize the T-gate structure that was subjected to spatial isolation from the heavily doped ohmic contact layer by utilizing air, as shown in FIG. 4K. The knee voltage of the GaN HEMT device in this example can reach 1 V or less.

The device provided in this example is a depletion-mode device, but a dielectric layer is arranged between the gate electrode and the cap layer so that the device becomes an enhanced device.

Example 3

Figure 7A:
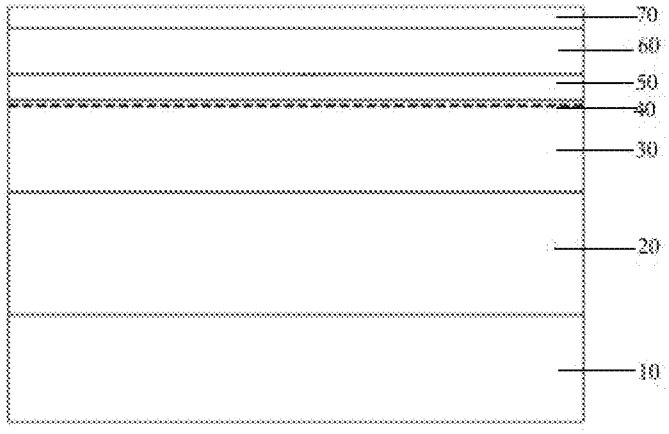
FIGS. 7A-7K are flowcharts of fabricating a high-electron-mobility transistor structure as shown in FIG. 5 provided in example 3 of the present application.
Figure 7B:
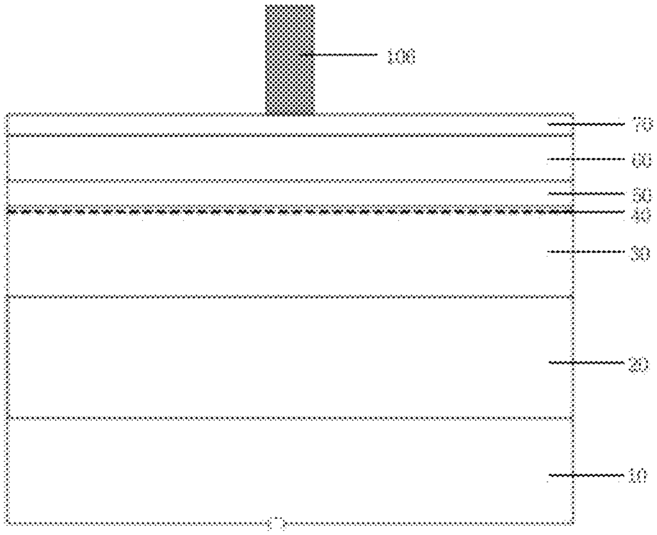
Figure 7C:
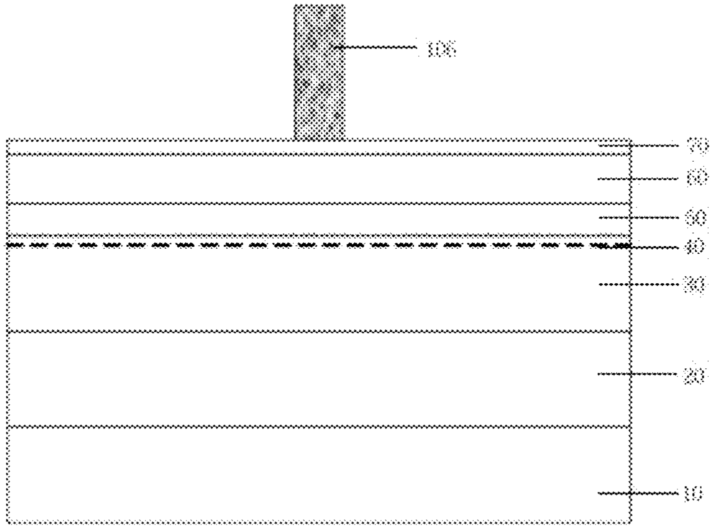
Figure 7D:
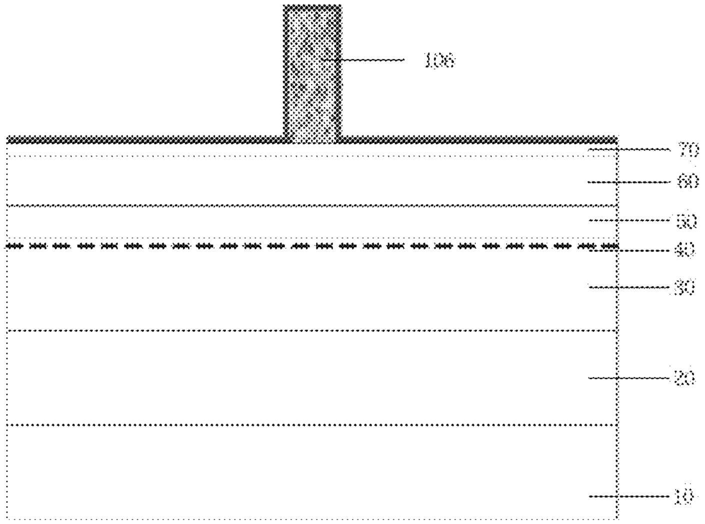
Figure 7E:
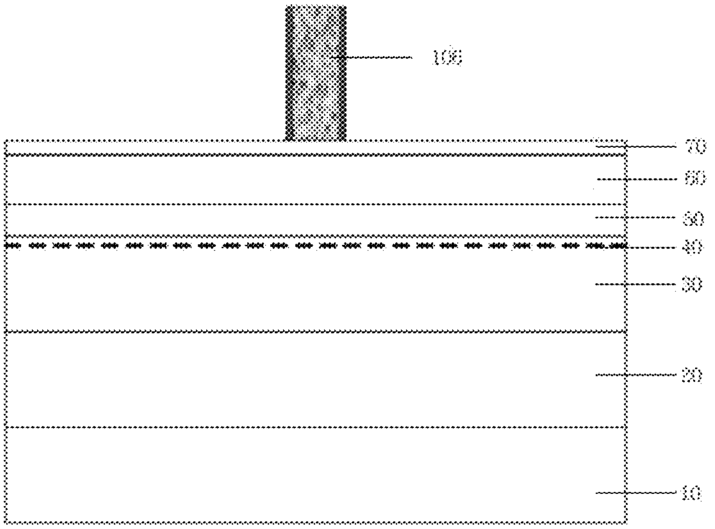
Figure 7F:
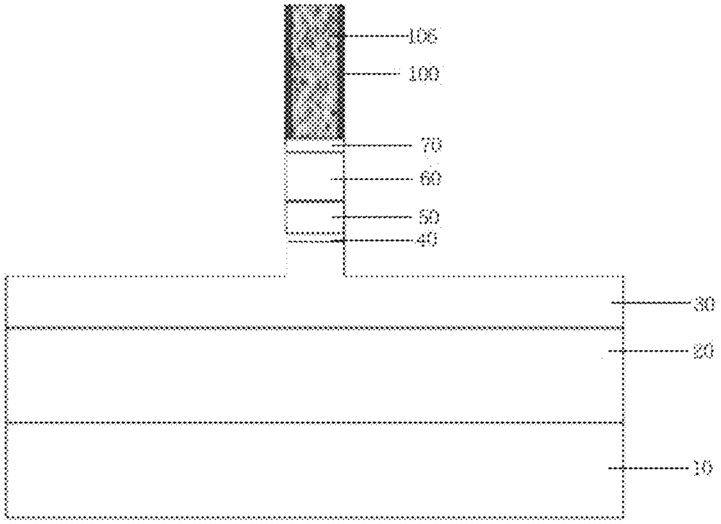
Figure 7G:
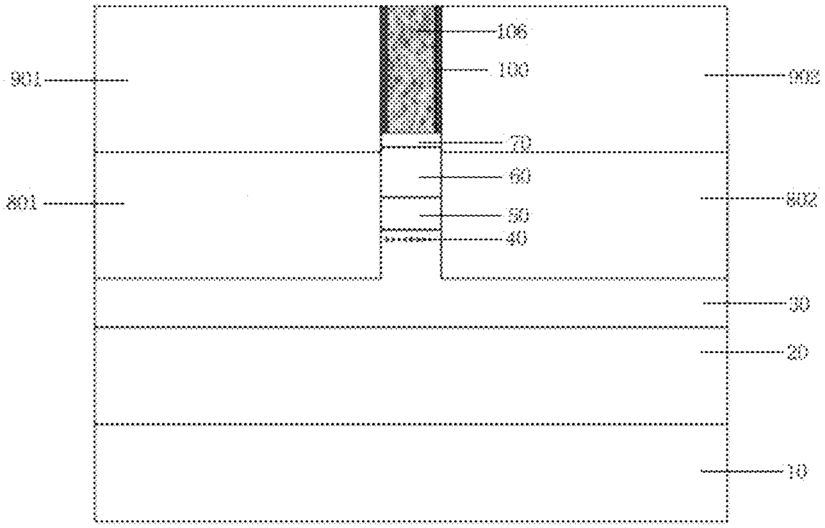
Figure 7H:
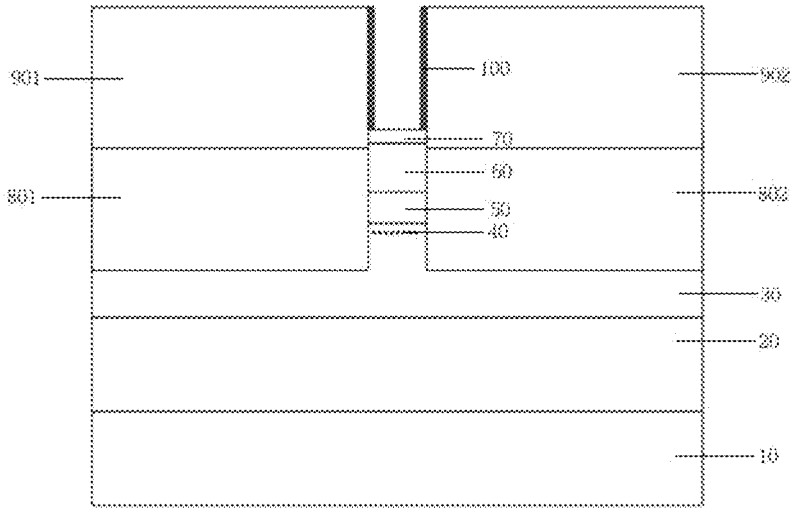
Figure 7I:
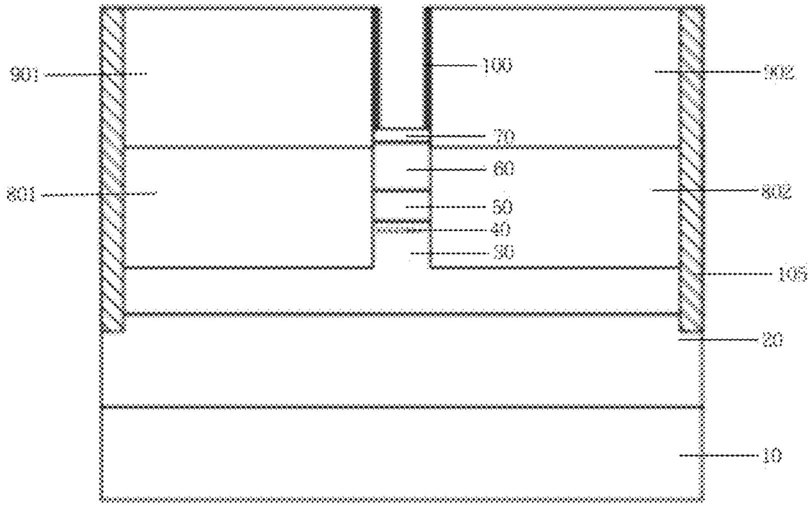
Figure 7J:
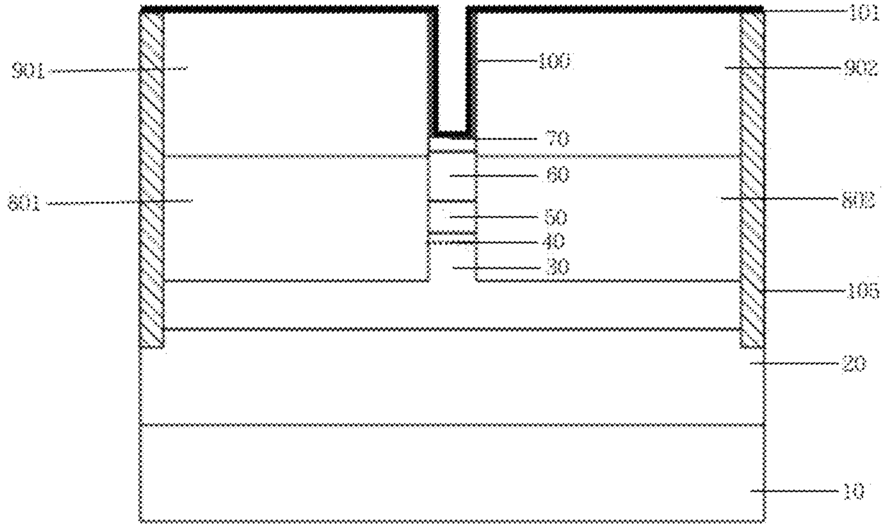
Figure 7K:
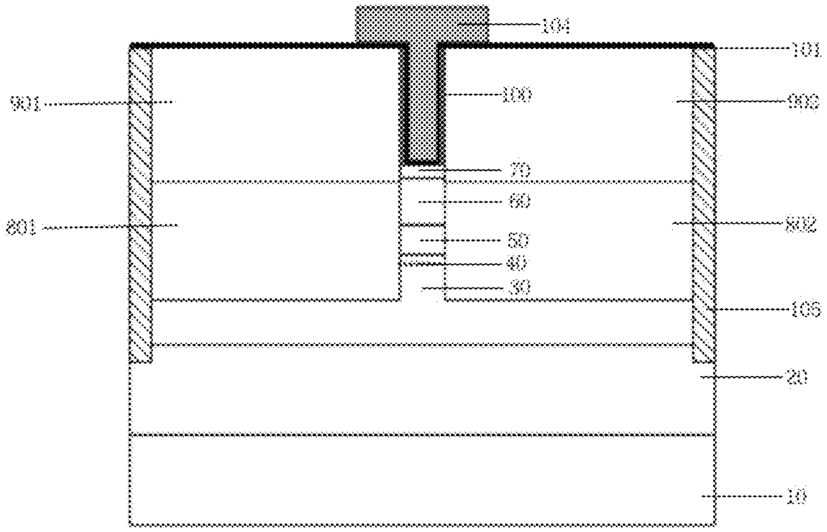

A fabricating method of a high-electron-mobility transistor structure as shown in FIG. 5 provided in this example can include the following steps:

Step 1), successively epitaxially growing a GaN buffer layer 20 with a thickness of 1500 nm, a GaN first semiconductor layer 30 with a thickness of 150 nm, an AlN insertion layer 50 with a thickness of 1 nm, an AlGaN second semiconductor layer 60 with a thickness of 5 nm and a GaN cap layer 70 with a thickness of 2 nm on a sapphire substrate 10, wherein a two-dimensional electron gas channel 40 was formed below the surface of the GaN first semiconductor layer 30 close to the surface of the AlN insertion layer 50, as shown in FIG. 7A;

Step 2), defining the size, namely, the gate electrode length $L_G$≈50-500 nm, of the gate foot of the T-type gate on the epitaxial structure by using HSQ electronic photoresist 106, as shown in FIG. 7B;

Step 3), the HSQ electronic photoresist 106 was cured by an annealing process, wherein the annealing temperature was about 400° C., as shown in FIG. 7C;

Step 4), a SiN sidewall dielectric layer with a thickness of 5 nm was deposited on the device surface formed in step 3) by using a low pressure chemical vapor deposition (LPCVD), as shown in FIG. 7D, and then the GaN cap layer 70 and the SiN sidewall dielectric layer on the upper surface of the HSQ electronic photoresist were etched away by using a self-aligned etching technology, as shown in FIG. 7E;

Step 5), a source electrode contact region and a drain electrode contact region were etched by using the cured HSQ electronic photoresist 106 as the mask and using ICP, and the GaN cap layers 70, the AlGaN second semiconductor layers 60, the AlN insertion layers 50 and the partially thickness of GaN first semiconductor layers 30 in the source electrode contact region and the drain electrode contact region were removed, so that the region of the GaN first semiconductor layer 30 corresponding to the gate electrode 104 was formed into a bulge portion, the AlN insertion layers 50, the AlGaN second semiconductor layers 60 and the GaN cap layers 70 of the rest part were distributed on the bulge portion, as shown in FIG. 7F;

Step 6), an n-type heavily doped GaN material layers were epitaxially grown in the source electrode contact region and the drain electrode contact region which were subjected to etching by continuing to use the cured HSQ electronic photoresist 106 as the mask and adopting the MOCVD technology to form a first heavily doped region 801 and a second doped region 802, the thicknesses and doping concentrations of the first heavily doped region 801 and the second doped region 802 (i.e., the surfaces of the heavily doped region 801 and the second doped region 802 were higher than the surface of a two-dimensional electron gas channel 40) ensured that the first doped region and the second doped region formed good ohmic contact with the two-dimensional electron gas channel 40, then high resistance GaN material layers were epitaxially grown on the first heavily doped region 801 and the second doped region 802 to form a first high resistance region 901 and a second high resistance region 902, as shown in FIG. 7G;

Step 7), the HSQ electronic photoresist 106 was removed by using BOE solution or HF solution, as shown in FIG. 7H;

Step 8), the isolation region 105 of the active region was formed at both sides of the epitaxial structure by using an N ion injection technology, wherein the N ion injection energy was 100-400 keV, the N ion injection dose was $10^{12}$-$10^{15}$/$cm^2$, and the injection depth exceeded the GaN buffer layer 20 by about 50-250 nm, as shown in FIG. 7I;

Step 9), a $Al_2O_3$ dielectric layer 101 with a thickness of 1 nm was deposited on the surface of the device formed in step 8) by using ALD, as shown in FIG. 7J;

Step 10), the gate electrode 104 was fabricated by using the first high resistance region 901 and the second high resistance region 902 as the support layers of the gate cap of the gate electrode 104, wherein the gate electrode 104 was made of Ni/Au, and had a thickness of 50 nm/250 nm, as shown in FIG. 7K;

Step 11), windows were formed on the $Al_2O_3$ dielectric layer 101, the first high resistance region 901 and the second high resistance region 902, and the source electrodes 102 and the drain electrodes 103 were fabricated in the windows by using use the electron beam evaporation technology, wherein the source electrode and the drain electrode were made of Ti/Au and had a thickness of 50 nm/250 nm, and the fabrication of the high-electron-mobility transistor structure was completed, as shown in FIG. 5.

It is noted that the process steps in this example can be adjusted according to practical situations, as long as the final device can be implemented, which is well-known to those skilled in the art, and cannot be described in detail.

Example 4

Figure 8A:
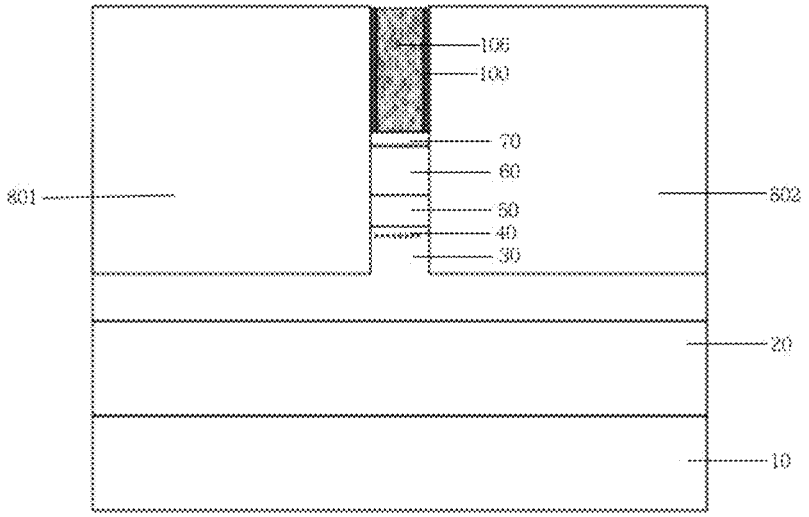
FIGS. 8A-8B are flow charts of fabricating a high-electron-mobility transistor structure as shown in FIG. 5 provided in example 4 of the present application.
Figure 8B:
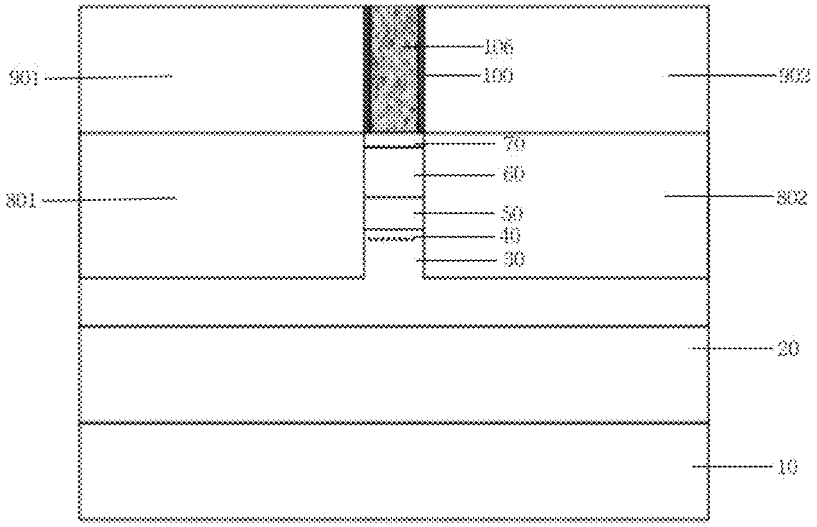

A fabricating method of a high-electron-mobility transistor structure as shown in FIG. 5 provided in this example is basically similar to that in example 1 except that:

Step 6), an n-type heavily doped GaN material layer was epitaxially grown in the source electrode contact region and the drain electrode contact region which were subjected to etching by using the cured HSQ electron photoresist 106 as the mask to form the first heavily doped region 801 and the second heavily doped region 802, the thicknesses and doping concentrations of the first heavily doped region 801 and the second doped region 802 ensured that the first heavily doped region and the second doped region formed good ohmic contact with the two-dimensional electron gas channel 40, as shown in FIGS. 8A-8B, then the n-type heavily doped layer GaN materials were transformed at the specified depths of the first heavily doped region 801 and the second heavily doped region 802 from the surfaces of the first heavily doped region 801 and the second heavily doped region 802 to the inside of the first heavily doped region 801 and the second heavily doped region 802 into the first high resistance region 901 and the second high resistance region 902, wherein the specified depth was higher than the surface of the two-dimensional electron gas channel 40, as shown in FIG. 8B.

In the above examples of the present application, the self-alignment process and secondary epitaxy technology are adopted, and the heavily doped layer and high resistance layer composite is used as the support layer, and the T-type gate is directly built between the source electrode and the drain electrode, thereby realizing a high-electron-mobility transistor structure with short channel, near-full gate control, no access region series resistance and low parasitic effect, and improving the frequency characteristics and output efficiency of the device while effectively reducing the knee voltage of the device and improving the linearity of the device. Meanwhile, the high-electron-mobility transistor structure provided by the present application adopts the thin barrier-based heterojunction epitaxial structure, so as to fabricate the enhanced device fabrication without the groove gate etching process. Furthermore, the thin barrier-based material structure makes the device have large transconductance, which is conducive to improving the gain of the RF power amplifier.

Moreover, the high-electron-mobility transistor structure provided in the examples of the present application is also applicable to GaN HEMT devices with a back barrier structure or other back structures, as well as GaN HEMT devices with various polarity planes, including a Ga surface, an N surface, etc.

In addition, the applicant of this case also conducted experiments with other raw materials, process operation and process conditions described in this specification with reference to the aforementioned embodiments, and obtained relatively ideal results.

It should be understood that the technical solution of the present application is not limited to the limitations of the above specific implementation cases. Without departing from the scope of protection of the purpose and claims of the present application, technical deformations made according to the technical solution of the present application are all included within the scope of protection of the present application.

What is claimed is:

1. A high-electron-mobility transistor structure, comprising:

an epitaxial structure, comprising a heterojunction including a first semiconductor layer and a second semiconductor layer, a carrier channel being formed between the first semiconductor layer and the second semiconductor layer; and a source electrode, a drain electrode, and a gate electrode disposed on the epitaxial structure, the source electrode being electrically connected with the drain electrode through the carrier channel;

wherein, a coincidence rate between an orthographic projection of a gate foot of the gate electrode on the first semiconductor layer and an orthographic projection of the second semiconductor layer on the first semiconductor layer is more than 80%;

wherein the epitaxial structure further comprises a heavily doped region and a high resistance region, the heavily doped region is arranged on the heterojunction and forms an ohmic contact with the carrier channel, the source electrode and the drain electrode form an ohmic contact with the heavily doped region, the high resistance region is disposed on the heavily doped region, the source electrode is isolated from the gate electrode by the high resistance region, and the drain electrode is isolated from the gate electrode by the high resistance region;

wherein the heavily doped region comprises a first heavily doped region matched with the source electrode and a second heavily doped region matched with the drain electrode, the first heavily doped region and the second heavily doped region are respectively located at two sides of the second semiconductor layer, the high resistance region comprises a first high resistance region matched with the source electrode and a second high resistance region matched with the drain electrode;

wherein the source electrode penetrates through the first high resistance region and is in an ohmic contact with the first heavily doped region, and the drain electrode penetrates through the second high resistance region and is in an ohmic contact with the second heavily doped region;

wherein the high resistance region is formed by a secondary epitaxial growth, or by transforming a local region of the heavily doped region; and wherein an interface between the heavily doped region and the high resistance region is regulated by a mutant doping or a gradual doping.

2. The high-electron-mobility transistor structure according to claim 1, wherein the orthographic projection of the gate foot on the first semiconductor layer coincides with the orthographic projection of the second semiconductor layer on the first semiconductor layer; and the carrier channel is distributed in a region covered by the orthographic projection of the gate foot electrode on the epitaxial structure.

3. The high-electron-mobility transistor structure according to claim 1, wherein an upper surface of the heavily doped region is higher than a surface of the carrier channel.

4. The high-electron-mobility transistor structure according to claim 3, wherein the carrier channel is a two-dimensional electron gas channel, the second semiconductor layer is arranged on the first semiconductor layer, and the first and second heavily doped regions are of n type; or the carrier channel is a two-dimensional hole gas channel, and the first and second heavily doped regions are of p type.

5. The high-electron-mobility transistor structure according to claim 4, wherein the first semiconductor layer comprises a first region and a second region, a bulge portion is formed in the first region, the second semiconductor layer is arranged on the bulge portion, the first heavily doped region and the second heavily doped region are arranged on the second region and distributed at two sides of the bulge portion.

6. The high-electron-mobility transistor structure according to claim 3, wherein a cap layer is distributed between the gate electrode and the second semiconductor layer;

the gate electrode is electrically isolated from the cap layer by the dielectric layer; and the epitaxial structure further comprises an insertion layer distributed between the first semiconductor layer and the second semiconductor layer.

7. The high-electron-mobility transistor structure according to claim 6, wherein the epitaxial structure comprises a Ga polar surface or an N polar surface.

8. The high-electron-mobility transistor structure according to claim 1, wherein the gate electrode comprises a gate cap and the gate foot, wherein the gate cap is arranged on the high resistance region and supported by the high resistance region, the gate foot is arranged in the epitaxial structure, and the carrier channel is distributed right under the gate foot;

a size of the gate cap in a direction of a source-drain channel is larger than a size of the gate foot in the direction of the source-drain channel, and the size of the gate foot in the direction of the source-drain channel is smaller than or equal to a length of the carrier channel;

the gate electrode is a T-type gate; and the gate electrode is electrically isolated from the second semiconductor layer by the dielectric layer; and a side wall dielectric layer is also formed between the side wall of the gate foot and the high resistance region.

9. The high-electron-mobility transistor structure according to claim 1, wherein a dielectric layer is arranged between the gate electrode and the heterojunction;

the dielectric layer is further configured for obstructing the gate electrode and the high resistance region, or the gate electrode is directly isolated from the high resistance region by air; and the dielectric layer further extends and covers a surface of the epitaxial structure, and the source electrode and the drain electrode are matched with the epitaxial structure through corresponding windows formed on the dielectric layer.

10. The high-electron-mobility transistor structure according to claim 1, further comprising an isolation region formed in the epitaxial structure and configured for isolating an active region.

11. The high-electron-mobility transistor structure according to claim 1, wherein a material of the epitaxial structure comprises III-V group compounds;

the high-electron-mobility transistor structure comprises a nitrogen polar high-electron-mobility transistor (HEMT) device structure or an HEMT device structure having a back barrier structure;

the high-electron-mobility transistor structure is of a depletion-mode device structure or an enhanced device structure;

the high-electron-mobility transistor structure further comprises a substrate where the epitaxial structure is formed; and the epitaxial structure further comprises a buffer layer distributed between the substrate and the first semiconductor layer.

12. A power amplifier, comprising the high-electron-mobility transistor structure according to claim 1.

13. The power amplifier according to claim 12, comprising a power amplifier with a radio frequency wave band, a millimeter wave band or a terahertz wave band.

* * * * *